(12) United States Patent
Hsieh et al.

(10) Patent No.: US 10,910,321 B2
(45) Date of Patent: Feb. 2, 2021

(54) SEMICONDUCTOR DEVICE AND METHOD OF MAKING THE SAME

(71) Applicant: TAIWAN SEMICONDUCTOR MANUFACTURING CO., LTD., Hsinchu (TW)

(72) Inventors: Cheng-Chieh Hsieh, Tainan (TW); Hau Tao, Hsinchu (TW); Yung-Tien Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/200,623

(22) Filed: Nov. 26, 2018

(65) Prior Publication Data
US 2019/0164905 A1   May 30, 2019

Related U.S. Application Data

(60) Provisional application No. 62/592,136, filed on Nov. 29, 2017.

(51) Int. Cl.
| | | |
|---|---|---|
| *H01L 23/552* | (2006.01) | |
| *H01L 23/64* | (2006.01) | |
| *H01L 23/498* | (2006.01) | |
| *H01L 23/31* | (2006.01) | |
| *H01L 23/367* | (2006.01) | |

(Continued)

(52) U.S. Cl.
CPC ....... *H01L 23/552* (2013.01); *H01F 17/0033* (2013.01); *H01L 21/486* (2013.01); *H01L 21/4853* (2013.01); *H01L 21/563* (2013.01); *H01L 23/3157* (2013.01); *H01L 23/3677* (2013.01); *H01L 23/49822* (2013.01); *H01L 23/49827* (2013.01); *H01L 23/49838* (2013.01); *H01L 23/642* (2013.01); *H01L 23/645* (2013.01); *H01L 24/16* (2013.01); *H01L 25/0652* (2013.01); *H01L 25/071* (2013.01); *H01L 25/112* (2013.01); *H01L 2224/16227* (2013.01); *H01L 2924/19041* (2013.01); *H01L 2924/19042* (2013.01); *H01L 2924/19103* (2013.01); *H01L 2924/3025* (2013.01)

(58) Field of Classification Search
CPC . H01L 25/0652; H01L 25/071; H01L 25/112; H01L 23/5384; H01L 23/538; H01F 7/033
USPC ........................................................ 257/531
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |

(Continued)

*Primary Examiner* — David Vu
*Assistant Examiner* — Brandon C Fox
(74) *Attorney, Agent, or Firm* — McDermott Will & Emery LLP

(57) ABSTRACT

A semiconductor device includes an interposer disposed on a substrate. A first major surface of the interposer faces the substrate. A system on a chip is disposed on a second major surface of the interposer. The second major surface of the interposer opposes the first major surface of the interposer. A plurality of first passive devices is disposed in the first major surface of the interposer. A plurality of second passive devices is disposed on the second major surface of the interposer. The second passive devices are different devices than the first passive devices.

20 Claims, 20 Drawing Sheets

(51) Int. Cl.
  *H01L 21/48*    (2006.01)
  *H01L 21/56*    (2006.01)
  *H01L 23/00*    (2006.01)
  *H01L 25/07*    (2006.01)
  *H01L 25/065*   (2006.01)
  *H01L 25/11*    (2006.01)
  *H01F 17/00*    (2006.01)

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2007/0057303 A1* | 3/2007 | Su | H01L 27/1087 257/301 |
| 2009/0185317 A1* | 7/2009 | Dijkhuis | H01L 27/0248 361/56 |
| 2014/0177189 A1* | 6/2014 | Liu | H01L 24/49 361/760 |
| 2014/0264732 A1* | 9/2014 | Elsherbini | H01L 23/64 257/531 |
| 2014/0268615 A1* | 9/2014 | Yun | H01L 23/49827 361/782 |
| 2016/0190113 A1* | 6/2016 | Sharan | H01L 21/78 257/531 |
| 2017/0103946 A1* | 4/2017 | Chang | H01L 21/486 |
| 2017/0290156 A1* | 10/2017 | Sturcken | H03H 1/00 |
| 2017/0290157 A1 | 10/2017 | Sturcken et al. | |
| 2018/0374843 A1* | 12/2018 | Muri | H01L 23/642 |
| 2019/0164681 A1* | 5/2019 | Kidwell, Jr. | H01L 28/10 |

* cited by examiner

SEMICONDUCTOR DEVICE AND METHOD OF MAKING THE SAME

RELATED CASE

The present application claims priority to and incorporates by reference the following U.S. Provisional Application 62/592,136 filed on Nov. 29, 2017 in its entirety.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size. The decrease in size of devices has been met with advancements in semiconductor manufacturing techniques such as forming multiple components in a vertical arrangement.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
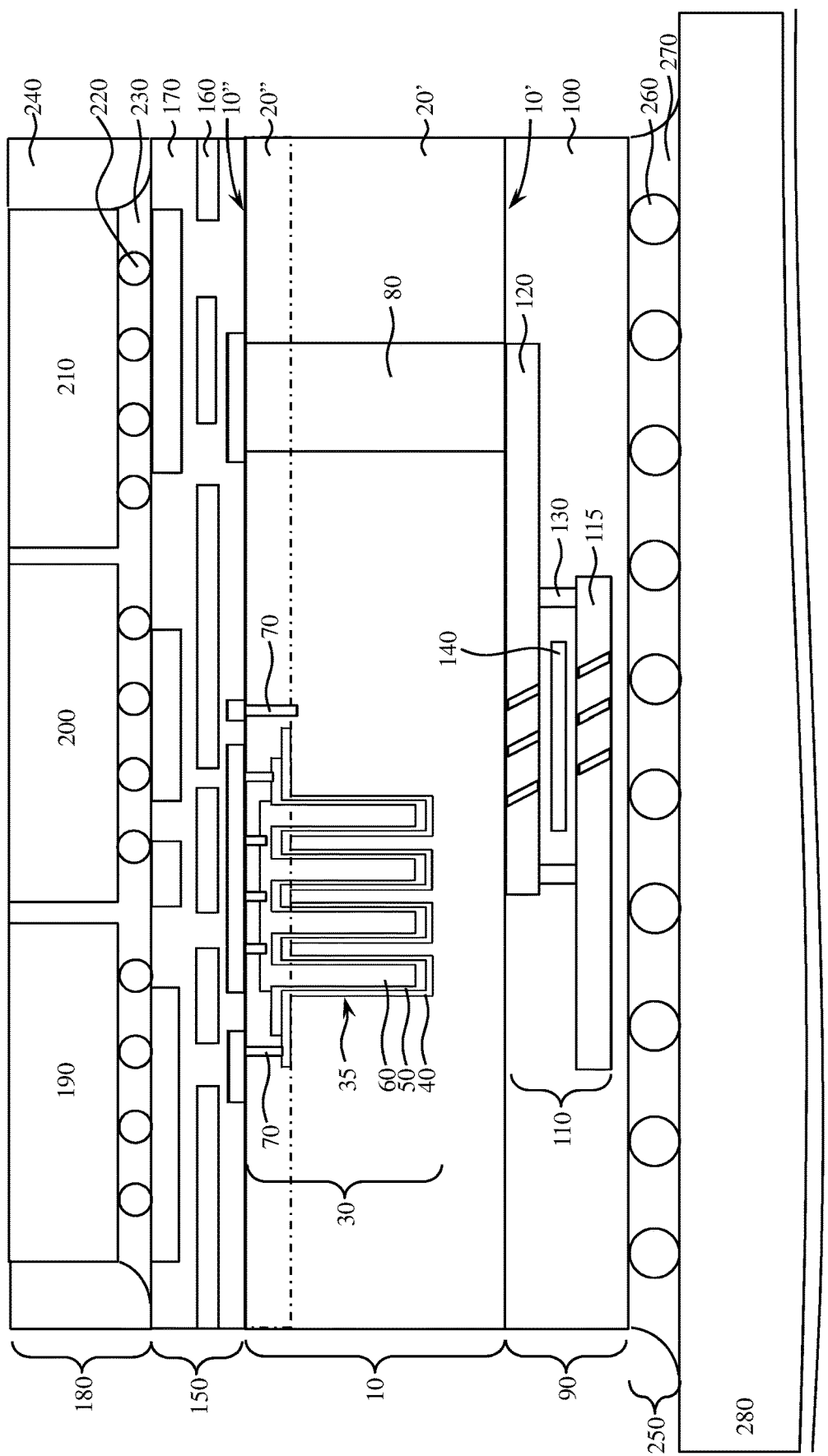
FIG. 1 shows a cross-sectional view illustrating a 2.5 D chip on wafer on substrate (CoWoS) semiconductor device according to an embodiment of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

A system on a chip or system on chip (SoC) includes several different integrated circuits, i.e. ICs or processors, together with memories and I/O interfaces. Each of the integrated circuit integrates various components of a computer or other electronic systems into one semiconductor chip. The various components contain digital, analog, mixed-signal, and often radio-frequency functions. Also, the SoC integrates processors (or controllers) with advanced peripherals like a graphics processing unit (GPU), a Wi-Fi module, or a co-processor. In the architecture of the SoC, both logic components and memory components are fabricated in the same silicon wafer. For high efficiency computing or mobile devices, multi-core processors are used, and the multi-core processors require large amounts of adjacent memories, such as several gigabytes. This increases the size of the silicon wafer of the SoC. Also, when the complexity of the ICs increases, the number of I/O pins could rise exponentially. Thus, in conventional device, passive components such as inductors, resistors, capacitors, transformers, and diodes are arranged side by side with the SoC. This arrangement also provides space for a cooling system to carry the thermal energy away from the heat sources in the passive components, as the thermal energy would compromise the performance of the processors, especially the processors and memory components in a highly integrated SoC. The present application provides an architecture of a chip on wafer on substrate (CoWoS) with an inductor installed vertically between an interposer (i.e. the wafer W in the CoWoS) and the substrate (i.e. S in CoWoS), instead of the side by side arrangement of the passive components and the SoC. Also, the interposer disposed vertically between the inductor and the SoC functions as a heat distributor to efficiently distribute the thermal energy away from the inductor through the through-silicon-vias (TSVs). Furthermore, the vertical arrangement of the active devices and passive devices provides a more efficient use of space for the semiconductor device. Devices according to the disclosed embodiments can be fabricated in an economical manner. In addition, locating the magnetic core inductors on an opposing side of the interposer from the chips and processors reduces the electromagnetic interference effect (parasitic inductance coupling (PIC)).

FIG. 1 shows a cross-sectional view of a 2.5 D chip on wafer on substrate (CoWoS) semiconductor device according to an embodiment of the disclosure. As shown in FIG. 1, a semiconductor device includes a device layer 180, a wiring layer 150, an interposer 10, an inductor layer 90 having a magnetic core inductor 110 with a horizontal central axis of a coil, a solder bump layer 250, and a substrate 280.

The interposer 10 is disposed on the substrate 280, with a first major surface 10' of the interposer 10 facing the substrate 280, and a second major surface 10" of the interposer 10 facing the wiring layer 150. The second major surface 10" of the interposer 10 opposes the first major surface 10' of the interposer 10. In some embodiments of the present disclosure, the interposer 10 comprises a semiconductor material substrate such as a silicon substrate. Alternatively, the interposer 10 includes a dielectric substrate. In some embodiments, the interposer 10 is substantially free from active devices such as transistors. The interposer may include passive devices such as capacitors, resistors, inductors, varactors and/or the like. In some embodiments of the present disclosure, the interposer 10 has a thickness of about 100 µm to about 300 µm.

On the second major surface 10" of the interposer 10, a plurality of first passive devices is disposed. In FIG. 1, the interposer 10 is formed of two layers 20' and 20" defined below and above a horizontal broken line within the interposer 10. During the formation of the devices on the second major surface 10" of the interposer 10, the portion of the interposer 10 below the horizontal broken line is formed first, and then the devices such as a deep trench capacitor 30 and a via 80 are formed in this portion of the interposer 10. Then, the portion of the interposer 10 above the horizontal broken line is formed to cover a portion of the deep trench capacitor 30. In some embodiments of the present disclosure, the first passive devices are deep trench capacitors 30. In some embodiments of the present disclosure, the deep trench capacitors 30 have a trench depth of about 20 µm to about 50 µm from the second major surface 10" of the interposer 10.

Also, on the second major surface 10" of the interposer 10, the wiring layer 150 is disposed on the interposer 10 without having any solder bump layer interposed therebetween, in some embodiments of the present disclosure. In the wiring layer 150, the electrical contact 160 and vertical pillar (not shown) between electrical contacts 160 are formed of any suitable conductive material, such as copper, aluminum, silver, gold, other metals, alloys, combination thereof, and/or the like. The wiring layer is formed by any suitable technique, such as electro-chemical plating (ECP), electroless plating, other deposition methods such as sputtering, printing, and chemical vapor deposition (CVD) methods, or the like. The electrical contact 160 is formed in a layer of insulating material, including dielectric materials, such as polyimide, benzocyclobutene (BCB), $SiO_2$, and $Si_3N_4$, in some embodiments of the present disclosure.

The wiring layer 150 has a top surface contacting a layer of bumps 220. The bumps 220 bond the device layer 180 to the system having the wiring layer 150, the interposer 10, and the inductor layer 90. The bumps 220 have a diameter in the range of about 25 µm to about 60 µm. The bumps 220 are smaller than the solder bumps 260, which have a diameter of about 80 µm to about 100 µm while bumps 220 have a diameter of about 25 µm to about 60 µm.

The device layer 180 includes a processor or chip 190 including a central processing unit (CPU), graphics processing unit (GPU), or any computing component, a memory component 200, and a system-on-chip (SoC) 210. The SoC 210 includes processors and numerous digital peripherals, and comes in a ball grid package with lower and upper connections in some embodiments of the present disclosure. The lower balls connect to a substrate, such as a circuit board and various peripherals, and upper bumps connect to integrated circuits in some embodiments of the present disclosure. In some embodiments of the present disclosure, the SoC 210 includes a controller, processor or digital signal processor (DSP) core—multiprocessor SoCs (MPSoCs) having more than one processor core. In some embodiments of the present disclosure, the SoC 210 includes memory blocks, which include a selection of ROM, RAM, EEPROM, and flash memory. In some embodiments of the present disclosure, the SoC 210 includes timing sources such as oscillators and phase-locked loops. The SoC 210 includes peripherals such as counter-timers, real-time timers and power-on reset generators. In some embodiments of the present disclosure, the SoC 210 includes external interfaces of industry standards such as USB, FireWire, Ethernet, USART, SPI; analog interfaces including ADCs and DACs; and voltage regulators and power management circuits.

The semiconductor device in FIG. 1 includes at least one semiconductor chip or processor 200 which includes an integrated circuit disposed on the second major surface 10" of the interposer 10 adjacent the SoC 210, in some embodiments of the present disclosure. The SoC 210, the processor 190, and the memory component 200 are attached through bumps 220 to a wiring layer 150 on a second major surface 10" of the interposer 10. In this embodiment, the arrangement of the processor 190, memory component 200, and the SoC 210 are in a 2.5 D architecture (the term 2.5 D architecture is originated from the fact that stacking ICs side-by-side on a through silicon interposer can be considered a midpoint between traditional ICs in package representing 2D integration, and chips stacked on top of one another that represents 3D integration architecture). In other embodiments of the present disclosure, the arrangement of devices 190, 200 and SoC 210 are in a 3 D architecture.

On the first major surface of the interposer, a plurality of second passive devices is disposed. The second passive devices located vertically below the first major surface 10' of the interposer 10 are devices different from the first passive devices on the second major surface 10" of the interposer 10, in some embodiments of the present disclosure. In some embodiments of the present disclosure, the second passive devices are magnetic core inductors 110 (one magnetic core inductor 110 is shown in the cross-sectional view of FIG. 1, other inductors are not shown). The inductor 110 functions as an energy storage element for the processor 190 and SoC 210, and volatile type memory component 200. In some embodiments of the present disclosure, the magnetic core inductors 110 having cores 140 are formed in a layer 90 having a thickness of about 50 µm to about 100 µm. In some embodiments of the present disclosure, the inductor 110 having the inductor core 140 in the inductor layer 90 is a ferromagnetic thin film inductor having a single-turn or multi-turn coils with a variety of yoke geometries. The ferromagnetic thin film inductor can be a spiral type, solenoid type, stripe type, and toroidal type. The inductance of the inductor relies on the yoke geometry, for example, a rectangular yoke as an inductance L given by the following equation (1).

$$L = \mu_0 \mu_r \frac{t}{2} \frac{l}{w} \qquad \text{Eq. (1)}$$

where t, l, and w are the thickness, length, and width of the yoke geometry. Thus, increasing the thickness l of the inductor yoke increases the inductance L. The eddy current and magnetic loss, however, increase with the increase of the thickness l of the inductor yoke, causing the quality factor (Q factor) to be less than one which is undesirable and a reduced inductor efficiency. To vertically incorporate the thin film inductor 110 with the core 140 into the CoWoS architecture in FIG. 1, the geometry of the yoke tends to have a reduced thickness l. To achieve a desirably high inductance of about 40 nH with high operating frequency (e.g. about 100 MHz) and with high Q factor (i.e. about 10), spiral and strip type inductors are used in the CoWoS architecture, in some embodiments of the present disclosure. Also, an elongated type inductor is also used in the CoWoS architecture, in some embodiments of the present disclosure. The magnetic core inductor 110 has a thickness less than or in a range from 50 µm to 100 µm.

The magnetic core inductors 110 are in electrical contact with the SoC 210 through conductive contacts formed in through silicon vias (TSVs) 80 in the interposer 10 and the electrical contacts 160 in the wiring layer 150, in some embodiments of the present disclosure. The inductor layer 90 has a bottom surface contacting a solder bump layer 260, in some embodiments of the present disclosure. The inductor layer 90 is disposed between the substrate 280 and the interposer 10, and contacts the interposer 10 without any solder bump layer interposed between the inductor layer 90 and the interposer 10, in some embodiments of the present disclosure.

In some embodiments of the present disclosure, the system of the wiring layer 150, the interposer 10, and the inductor layer 90 is bonded to the substrate 280 through a plurality of solder bumps 50. The bonding of the system, including the inductor layer 90, interposer 10, wiring layer 150, and the device layer 180 with bumps 220 to the substrate 280 is processed by a flip chip method which is also known as controlled collapse chip connection or, in short, C4. C4 is a method for interconnecting semiconductor devices, such as IC chips and electromechanical (MEMS), to external circuitry with solder bumps (i.e. solder bumps 260) that have been deposited onto the chip pads (not shown) on the substrate 280. The solder bumps 260 are deposited on the chip pads on the top side of the wafer during wafer processing.

In order to mount the chip to an external circuitry (e.g., a circuit board or another chip or wafer), the chip (in this situation, the system including layers 180, 150, 10, 90, and 250) is flipped over so that its top side faces down, and aligned so that its pads align with matching pads on the external circuit, and then the solder is reflowed to complete the interconnection. The solder bumps 260 include a ball grid array (BGA) with individual balls formed of a metal such as tin, silver, copper, or any other suitable materials in some embodiments of the present disclosure.

The solder bumps 260 are formed by initially sputter depositing a seed layer of conductive material (e.g., an underbump metallization) and then patterning a photolithographic material over the seed layer of conductive material (not shown). With the photolithographic material in place and exposing portions of the seed layer, an electro-chemical plating (ECP) process is utilized to plate the exposed portions of the seed layer within the openings of the photolithographic material. Once the plating has finished, the photolithographic material is removed, and the portions of the seed layer that were not plated (because they were covered by the photolithographic material), are removed using, e.g. a dry etch. Once in place, a reflow is performed in order to shape the solder material into the desired bump shape with a diameter of about 250 µm, in some embodiments of the present disclosure.

For the substrate 280 bonded with the system including layers 180, 150, 10, and 90 through the solder bumps 260, a first underfill material 270 is injected or otherwise formed in the space between the inductor layer 90 and the substrate 280, and is then cured to harden. The first underfill material 270 includes a liquid epoxy or epoxy resin and is used to prevent cracks from being generated due to thermal stress in the contacting portions between the solder bumps 260 and the substrate 280, and between the solder bumps 260 and the inductor layer 90.

Figure 2:
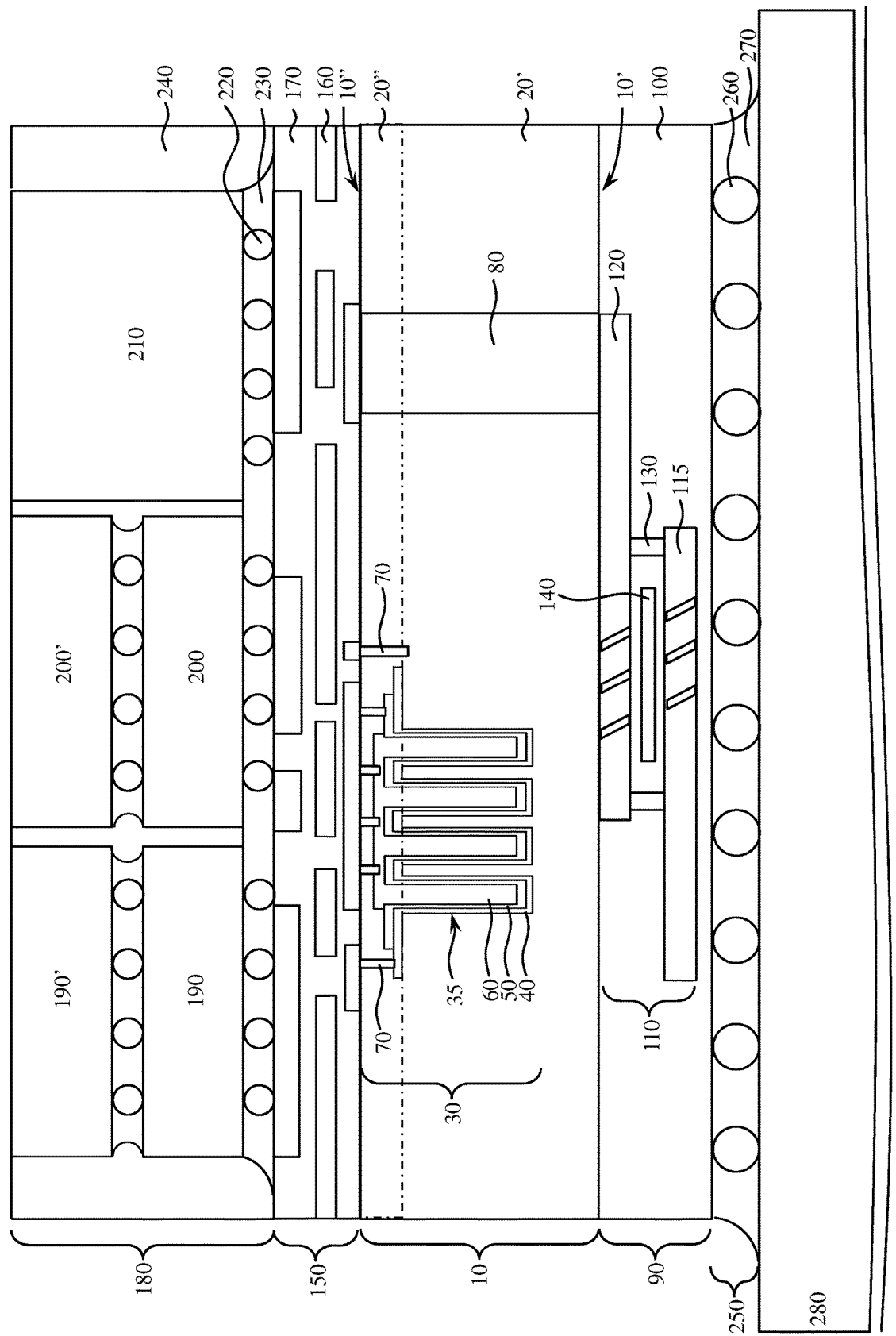
FIG. 2 shows a cross-sectional view illustrating a 3 D CoWoS semiconductor device according to an embodiment of the disclosure.

FIG. 2 shows a cross-sectional view illustrating a 3 D CoWoS semiconductor device according to an embodiment of the disclosure. As shown in FIG. 2, a semiconductor device includes a device layer 180, a wiring layer 150, an interposer 10, an inductor layer 90 having a magnetic core inductor 110 with a horizontal central axis of a coil, a solder bump layer 250, and a substrate 280. This embodiment has a similar architecture as that in FIG. 1, except the devices in the device layer 180 are arranged according to a 3 D architecture. That is, FIG. 2 shows that the processors 190 and 190' are stacked vertically through bumps 220. Also, FIG. 2 shows that the memory components 200 and 200' are also stacked vertically through bumps 220. The SoC 210 has an increased size in this embodiment for extensive computation capabilities, in some embodiments of the present disclosure. In some embodiments of the present application, the SoC 210 also includes telecommunication and global positioning devices. In this embodiment, the magnetic core inductor 110 has a horizontal central axis of the coil.

Figure 3:
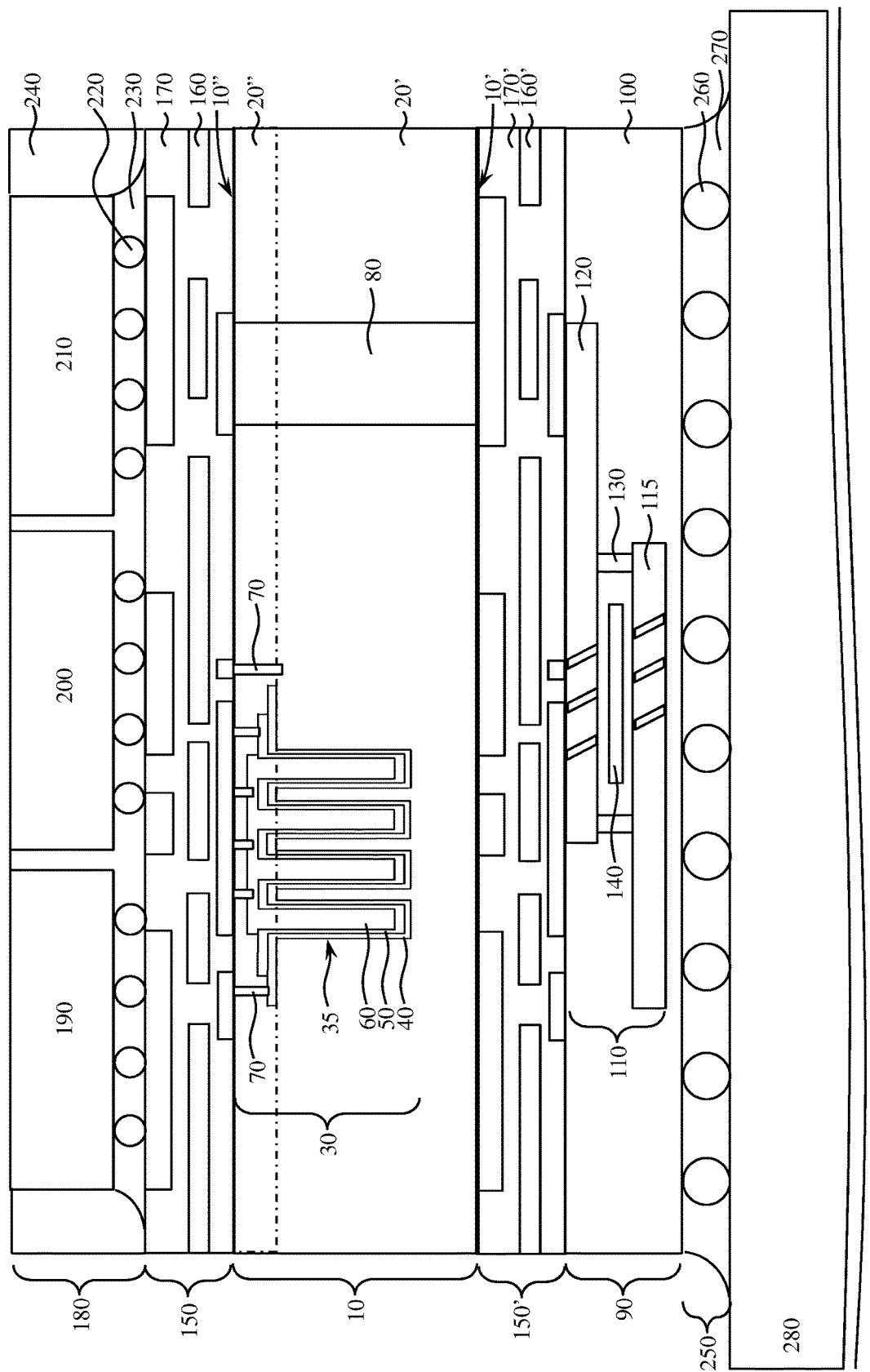
FIG. 3 shows a cross-sectional view illustrating a 2.5 D CoWoS semiconductor device according to an embodiment of the disclosure.

FIG. 3 shows a cross-sectional view illustrating a 2.5 D CoWoS semiconductor device according to another embodiment of the disclosure. As shown in FIG. 3, a semiconductor device includes a device layer 180, a wiring layer 150, an interposer 10, an inductor layer 90 having a magnetic core inductor 110 with a horizontal central axis of a coil, a solder bump layer 250, and a substrate 280. This embodiment has a similar architecture as that in FIG. 1, except an additional wiring layer 150' is included. The wiring layer 150' is interposed between the interposer 10 and the inductor layer 90, in some embodiments of the present disclosure. In some embodiments of the present disclosure, the wiring layer 150' is bonded to the inductor layer 90 through bumps 220 (not shown). In some embodiments of the present disclosure, tor the wiring layer 150' bonded to the inductor layer 90, a second underfill (not shown) is injected to the space between the wiring layer 150' and the inductor layer 90, and is then cured to harden. The underfill prevents cracks from being generated in the contacting portion between the wiring layer 150' and the bumps 220 and between the bumps 220 and the inductor layer 90. In this embodiment, the magnetic core inductor 110 has a horizontal central axis of the coil.

Figure 4:
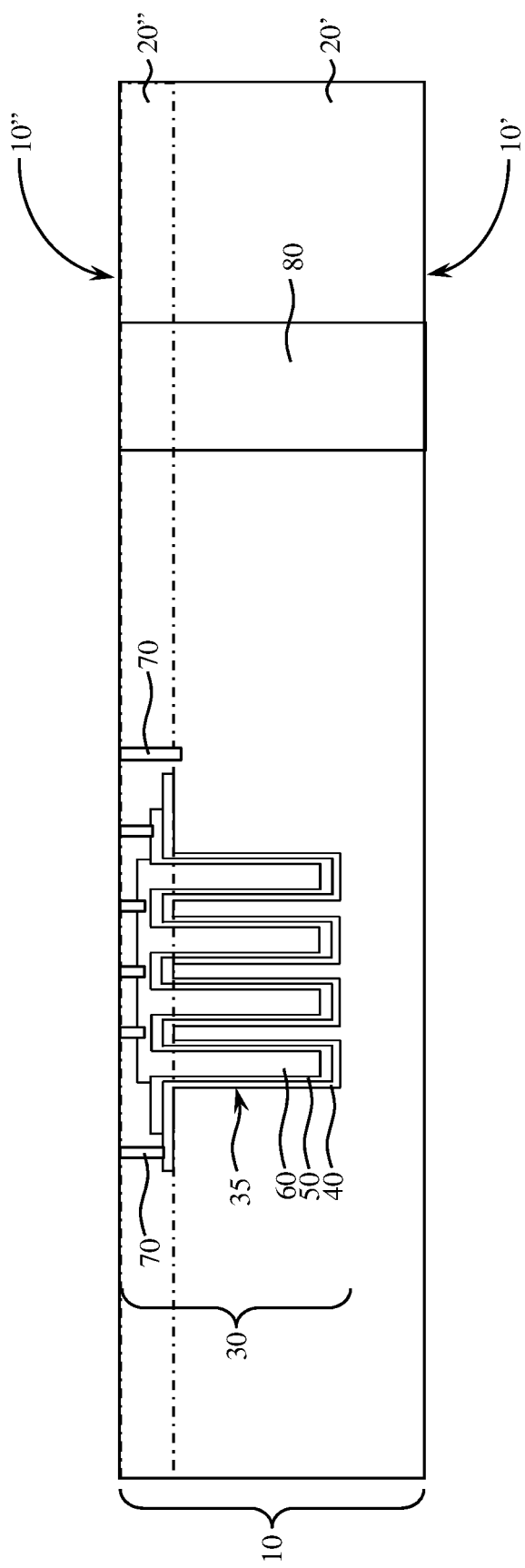
FIG. 4 shows a cross-sectional view illustrating an operation of making the 2.5 D CoWoS semiconductor device of FIG. 1 according to an embodiment of the disclosure.

FIGS. 4 through 9 show cross-sectional views illustrating operations of making the 2.5 D CoWoS semiconductor device of FIG. 1 according to an embodiment of the disclosure. FIG. 4 shows an operation of forming an interposer 10 and forming a deep trench capacitor 30 in the interposer 10. The formation of the interposer 10 includes the operations of forming the through silicon via (TSV) 80 and the operations of forming the deep-trench capacitor 30. High aspect ratio holes, such as the trenches 35 for the deep-trench capacitor 30, or the through silicon via (TSV) requires multiple steps of processing, including mask lithography, deep silicon etch, photoresist deposition and wafer cleaning, liner oxide deposition, barrier metal and copper (Cu) seed sputtering, electro-copper-plating (ECP), copper chemical mechanical polishing (CMP), and an optional TSV capping deposition in some embodiments of the present disclosure.

Mask lithography uses regular photolithography processing technique such as UV or EUV photolithography using a mask having a pattern of through holes or high-aspect ratio holes. A layer of photoresist is coated on the surface of the silicon wafer of the interposer 10. Then, the photoresist is processed through exposure and development to form a pattern of photoresist with openings exposing the top surface of the silicon wafer of the interposer 10.

After formation of the photoresist mask, an operation of deep silicon etch is carried out to form high aspect ratio holes or through silicon holes having a depth of a few tens to a few hundreds of μm. The deep silicon etch uses a $SF_6/O_2$ isotropic etch, in some embodiments of the present disclosure. During the reaction between the plasma of $SF_6$ and oxygen, fluorine is generated to etch the silicon. Since this isotropic etch forms scallops on the sidewall of the etched silicon hole, a passivation process is carried out using $C_4F_8$ to form $CF_2$ which adsorbs on the surface of the sidewalls of the etched silicon hole to form a Teflon-like polymer, flattening the sidewalls of the etched silicon hole. In this process, the high aspect ratio holes (having about 10 μm diameter by 100 μm depth) of the deep-trench capacitor 30 are formed. The fluorine-containing polymers deposited on the sidewalls of the etched silicon holes in the bottom layer 20' of the interposer 10 are removed. In other embodiments of the present application, the deep silicon etch is carried out by reactive ion etch (RIE) or a laser.

An operation of TSV liner deposition is then carried out to deposit a dielectric layer (such as silicon oxide, $SiO_2$) along the sidewalls of the etched silicon hole. The dielectric layer is an electrical insulator. The deposition is carried out by using high temperature thermal oxide deposition, plasma enhanced chemical vapor deposition (PECVD) with the use of silane and tetrathylorthosilicate (TEOS), or sub-atmospheric CVD (SACVD) of ozone ($O_3$)-TEOS.

An operation of barrier layer formation is carried out to form a barrier layer of tantalum (Ta) or titanium (Ti) that prevents copper (Cu) from diffusing from the TSV into the silicon during subsequent high temperature processing. Also, the barrier layer improves the adhesion between the copper seed layer and the dielectric layer of $SiO_2$ formed on the sidewall of the etched silicon hole or through hole. The deposition is carried out by physical vapor deposition (PVD) such as sputtering, pulsed laser deposition or a CVD process, such as MOCVD. Also, a copper seed layer is formed by physical vapor deposition, such as sputtering, in a separate chamber in an Ar plasma.

Then, an electroplating process is carried out to fill the deep silicon hole or through hole with copper or other metal, such as aluminum or tungsten. In this electroplating process, metal ions in a solution are plated onto the electrode by the action of an electric field. The plating can be carried out by conformal, bottom-up, or a mixed of both of conformal and bottom-up methods. In this process, organic additives are added to optimize the plating process. The additives include a suppressor (a chain polymer to coat the copper surface), an accelerator (a catalyst to increase the deposition rate of copper), and a leveler (a substance to deactivate the effect of the accelerator). For the deep silicon hole of the deep trench capacitor 30, electroplating is carried out by coating the sidewall with the copper as the bottom electrode layer of the capacitor 30 without filling the deep silicon hole.

A chemical mechanical polishing (CMP) operation is carried out to remove any metal overburden or mounts formed during the electroplating process. The CMP operation forms an oxide on the top surface of the metal filling the deep silicon hole or through hole and the oxide layer is then removed mechanically with abrasives in the CMP slurry. A high temperature annealing process is optionally carried out before the CMP operation. This annealing process stabilizes the grains of metal, such as copper, in the deep silicon hole or through hole. More than one step of CMP operation is optionally carried out to achieve surface planarization by removing thick metal overburden (e.g. more than 4 μm thick) as the metal overburden would cause a problem of warpage of the interposer 10.

Then, an operation of forming the deep trench capacitor 30 is carried out. A dielectric layer 50 such as a high k dielectric for the capacitor 30 coats the bottom electrode layer 40 by physical vapor deposition (PVD), such as sputtering or pulsed laser deposition, or chemical vapor deposition (CVD), such as MOCVD. Then a top electrode layer 60 fills the remaining space in the deep silicon hole by physical vapor deposition (PVD) such as sputtering or pulsed laser deposition or chemical vapor deposition (CVD) such as MOCVD. A top layer 20" of the interposer 10 covers the capacitor 30 by physical vapor deposition (PVD), such as sputtering or pulsed laser deposition, or chemical vapor deposition (CVD), such as MOCVD. Then, through holes are formed by aforementioned deep silicon etch method and filled by the aforementioned electroplating method to form vias 80.

Figure 5:
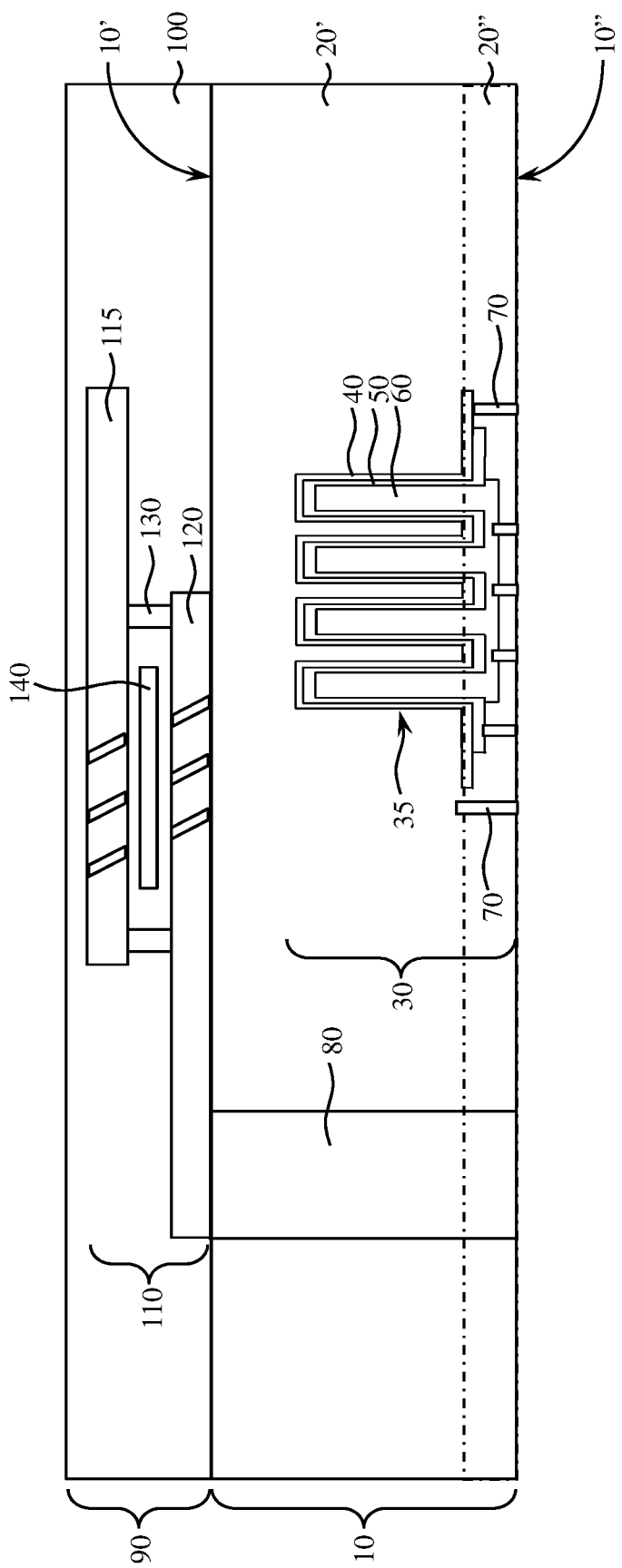
FIG. 5 shows a cross-sectional view illustrating an operation of making the 2.5 D CoWoS semiconductor device of FIG. 1 according to an embodiment of the disclosure.

FIG. 5 shows that an inductor layer 90 is formed on the first major surface 10' of the interposer 10. The first major surface 10' is processed by CMP before forming the inductor 110 on the first major surface 10', in some embodiments of the present disclosure. A dielectric material 100 fills the space around the inductor 110 so as to form the inductor layer 90, in some embodiments of the present disclosure. In another embodiment of the present disclosure, the thin film inductor 110 is formed by deposition of the layers 115, 120, core 140, and via 130, which is a magnetic via in some embodiments of the present disclosure. A dielectric material 100 filling the space around the inductor 110 is deposited by layer depositions to form the inductor layer 90. The dielectric material 100 includes polyimide, benzocyclobutene (BCB), $SiO_2$ and $Si_3N_4$ in some embodiments.

Figure 6:
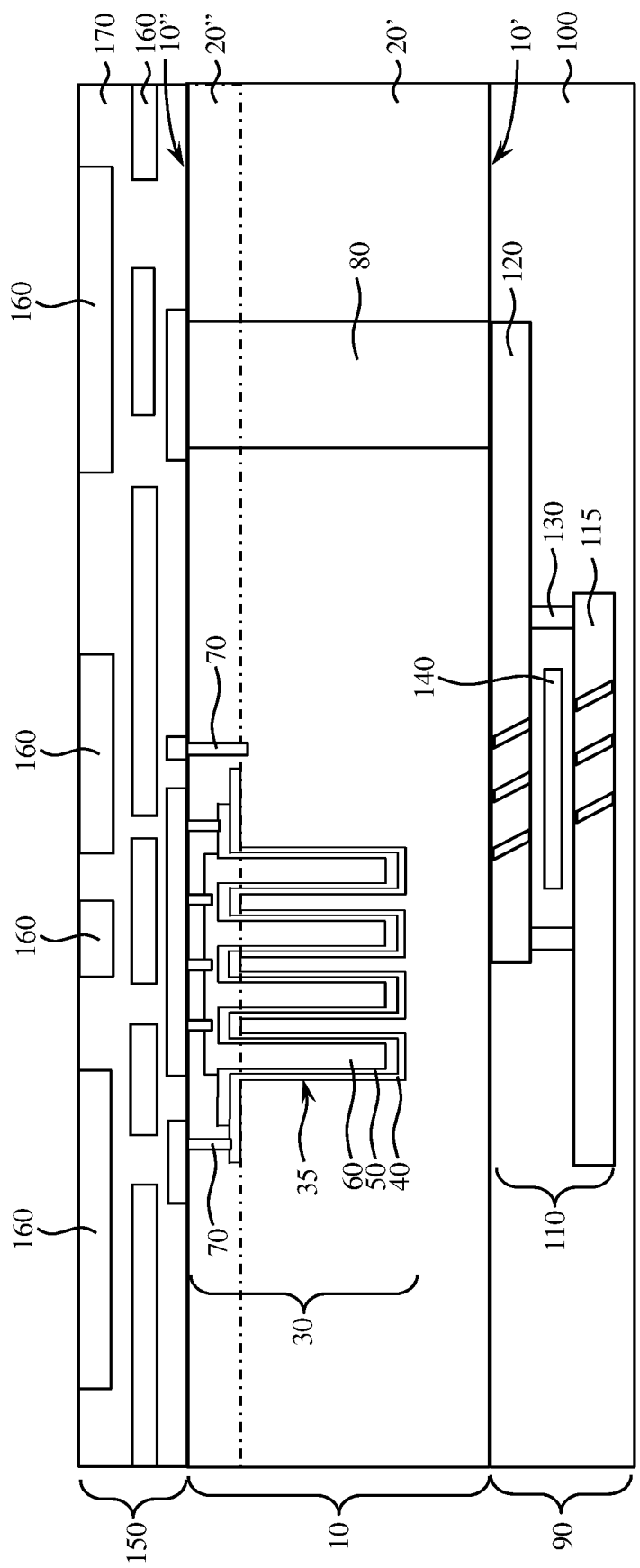
FIG. 6 shows a cross-sectional view illustrating an operation of making the 2.5 D CoWoS semiconductor device of FIG. 1 according to an embodiment of the disclosure.

FIG. 6 shows a cross-sectional view of an operation of forming a wiring layer 150 on the interposer 10. The wiring layer 150 is formed by metal deposition processes or plating process. An electrically insulating layer 170 fills the space between the metal layers in the wiring layer 150. In the wiring layer 150, the electrical contact 160 and vertical pillars (not shown) between electrical contacts 160 are formed of any suitable conductive material, such as copper, aluminum, silver, gold, other metals, alloys, combinations thereof, and/or the like. The contacts and pillars are formed by any suitable technique, such as electro-chemical plating (ECP), electroless plating, other deposition methods such as sputtering, printing, and chemical vapor deposition (CVD) methods, or the like. The electrical contact 160 is formed in a layer of insulating material 170 including dielectric materials such as polyimide, benzocyclobutene (BCB), $SiO_2$, and $Si_3N_4$, in some embodiments of the present disclosure.

Figure 7:
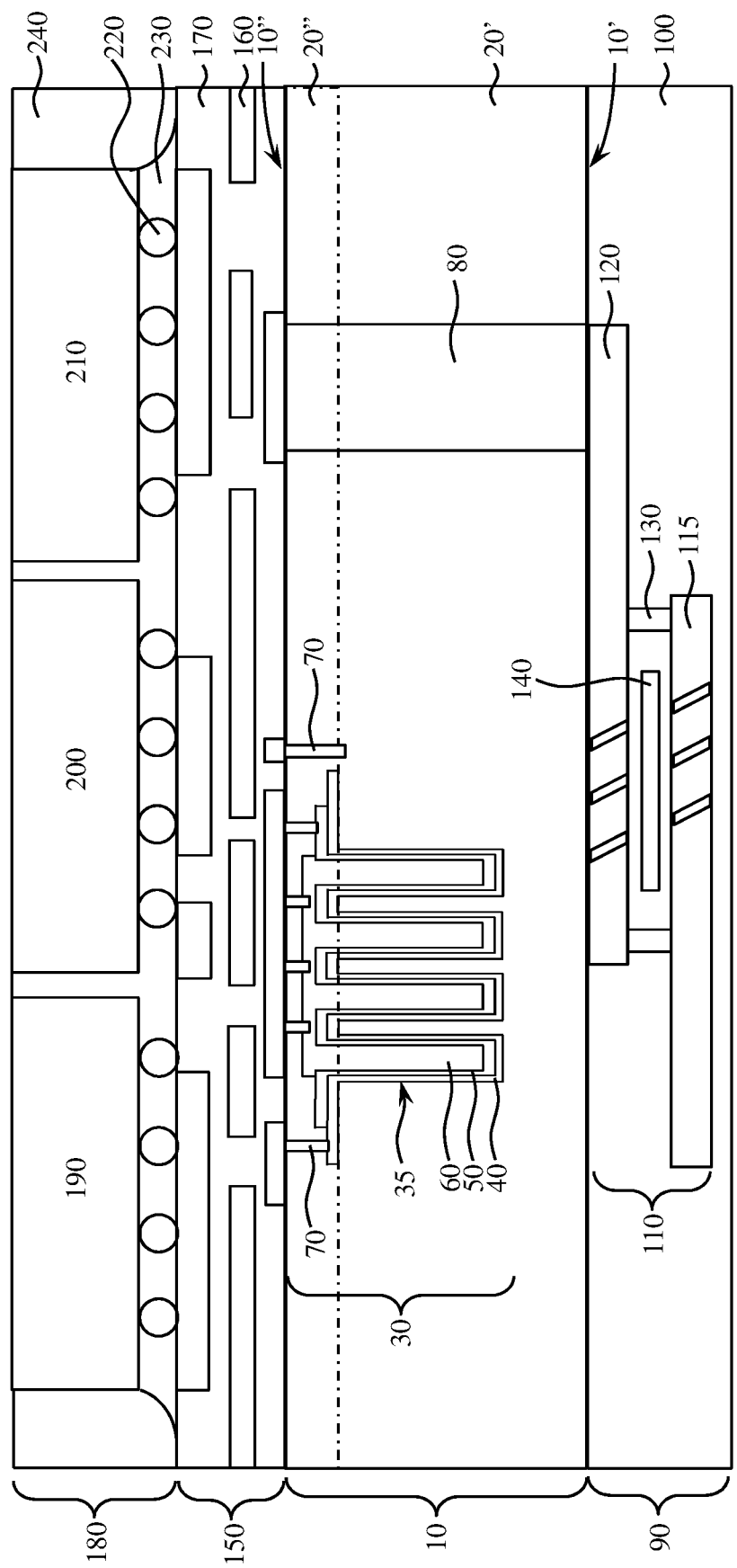
FIG. 7 shows a cross-sectional view illustrating an operation of making the 2.5 D CoWoS semiconductor device of FIG. 1 according to an embodiment of the disclosure.

FIG. 7 shows a cross-sectional view of an operation of forming a device layer 180 on the wiring layer 150. The device layer 180 is formed by bonding the processor 190, memory device 200, and SoC 210 to the contact pads (not shown) on the wiring layer 150 through bumps 220. An underfill 230 fills the space between the device layer 180 and the wiring layer 150, in some embodiments of the present disclosure. In another embodiment of the present disclosure, an air gap is provided between the device layer 180 and the wiring layer 150. An encapsulation layer 240 seals the components 190, 200, and 210, in some embodiments of the present disclosure.

Figure 8:
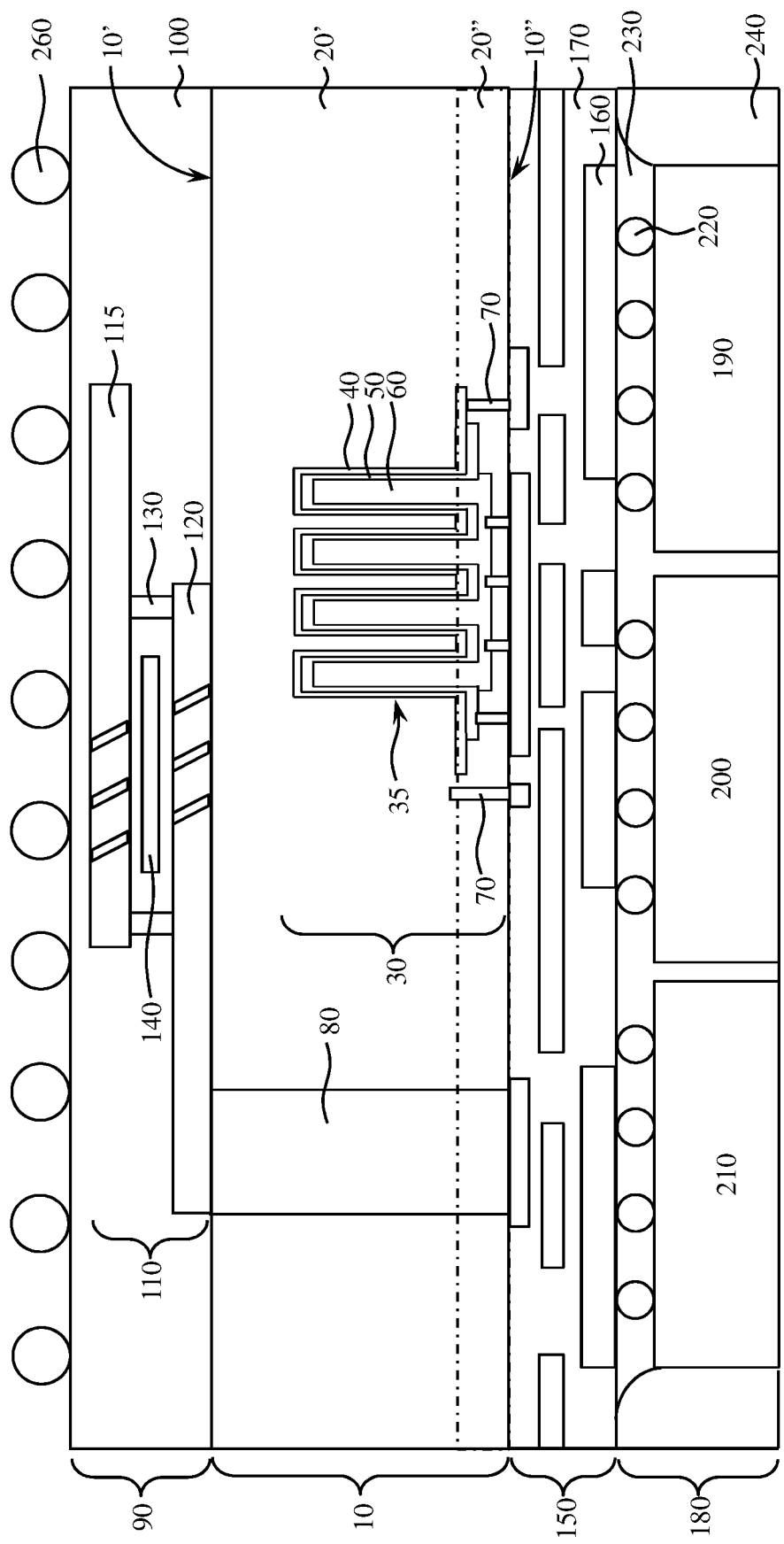
FIG. 8 shows a cross-sectional view illustrating an operation of making the 2.5 D CoWoS semiconductor device of FIG. 1 according to an embodiment of the disclosure.

FIG. 8 shows an operation of forming solder bumps 260 on the inductor layer 90. The solder bumps 260 are formed on contact pads (not shown).

Figure 9:
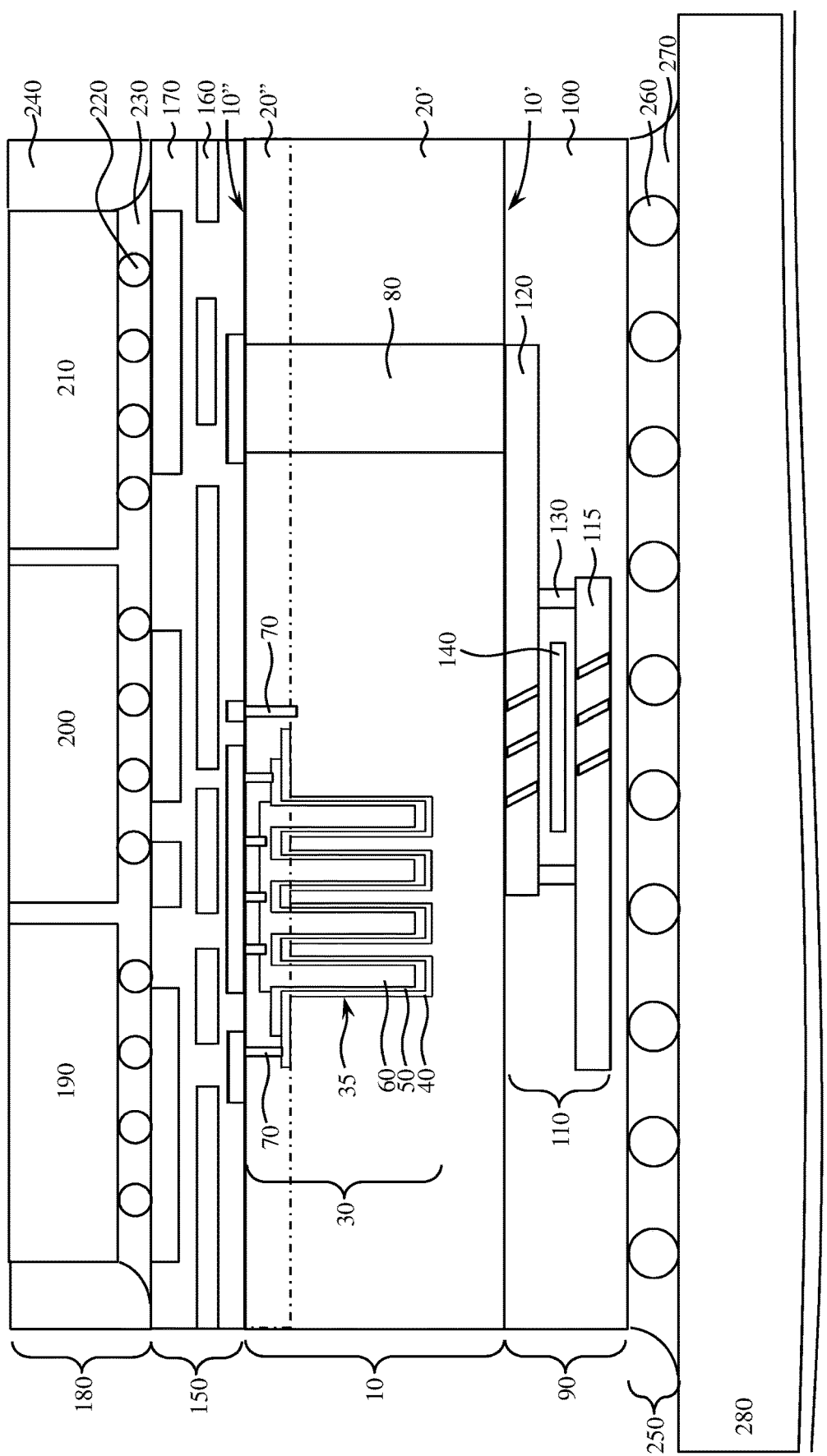
FIG. 9 shows a cross-sectional view illustrating an operation of making the 2.5 D CoWoS semiconductor device of FIG. 1 according to an embodiment of the disclosure, and this cross-sectional view shows the same structure as that in FIG. 1.

FIG. 9 shows a cross-sectional view of a flip chip operation bonding the system to a substrate 280. In this flip chip operation, the system having the inductor layer 90 is flipped over to bond the inductor layer 90 to the substrate 280. An underfill 270 fills the space between the inductor layer 90 and the substrate 280, in some embodiments of the present disclosure. In another embodiment of the present disclosure, an air gap is provided between the inductor layer 90 and the substrate 280.

Figure 10:
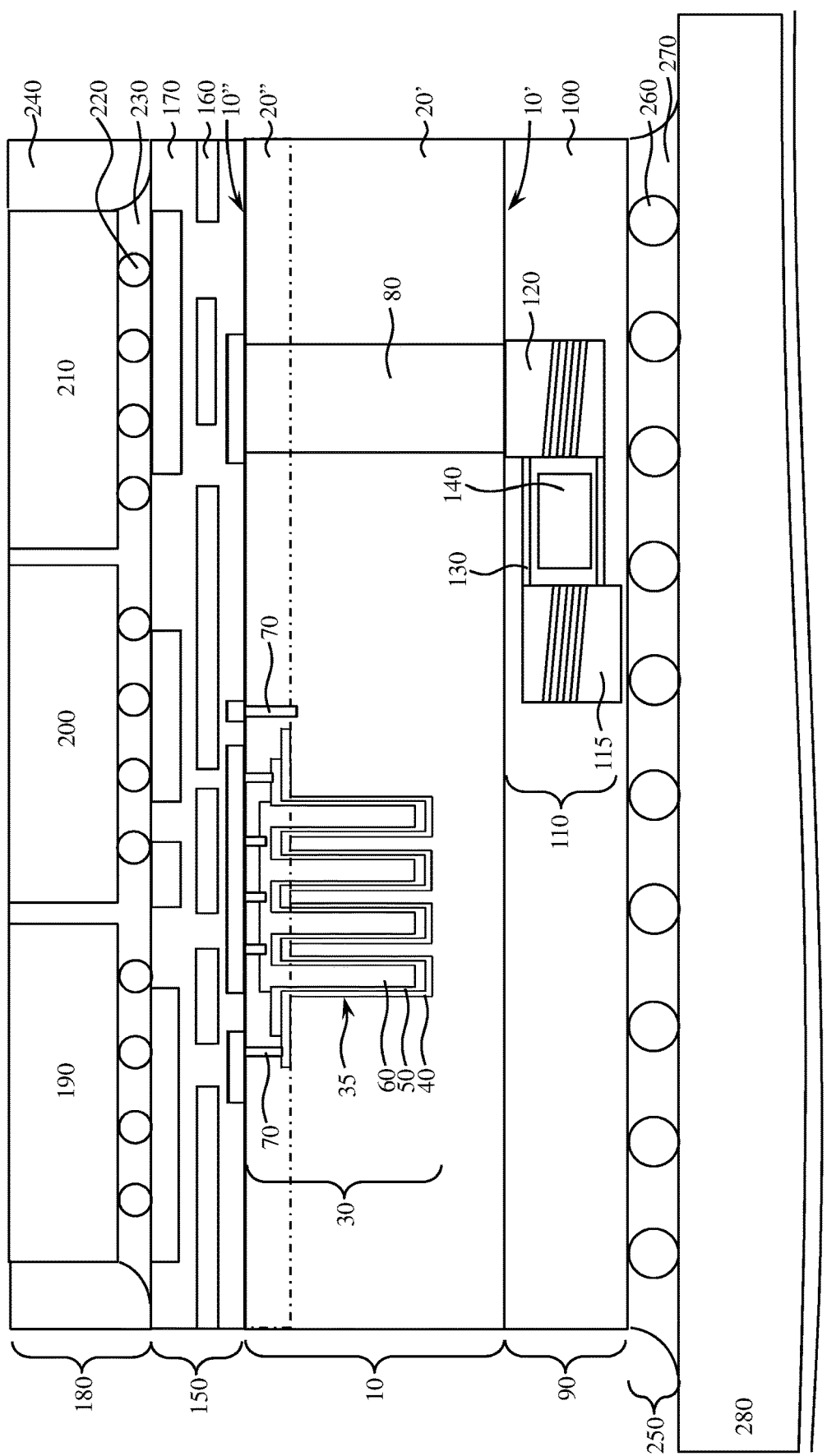
FIG. 10 shows a cross-sectional view illustrating a 2.5 D CoWoS semiconductor device according to an embodiment of the disclosure.

FIG. 10 shows a cross-sectional view of a 2.5 D chip on wafer on substrate (CoWoS) semiconductor device according to an embodiment of the disclosure. As shown in FIG. 10, a semiconductor device includes a device layer 180, a wiring layer 150, an interposer 10, an inductor layer 90 having a magnetic core inductor 110 with a vertical central axis of a coil, a solder bump layer 250, and a substrate 280.

The interposer 10 is disposed on the substrate 280, with a first major surface 10' of the interposer 10 facing the substrate 280, and a second major surface 10" of the interposer 10 facing the wiring layer 150. The second major surface 10" of the interposer 10 opposes the first major surface 10' of the interposer 10. In some embodiments of the present disclosure, the interposer 10 comprises silicon. In some embodiments of the present disclosure, the interposer 10 has a thickness of about 100 μm to about 300 μm.

On the second major surface 10" of the interposer 10, a plurality of first passive devices is disposed. In FIG. 10, the interposer 10 is formed of two layers 20' and 20" defined below and above a horizontal broken line within the interposer 10. During the formation of the devices on the second major surface 10" of the interposer 10, the portion of the interposer 10 below the horizontal broken line is formed first, and then the devices such as a deep trench capacitor 30 and a via 80 are formed in this portion of the interposer 10. Then, the portion of the interposer 10 above the horizontal broken line is formed to cover a portion of the deep trench capacitor 30. In some embodiments of the present disclosure, the first passive devices are deep trench capacitors 30. In some embodiments of the present disclosure, the deep trench capacitors 30 have a trench depth of about 20 μm to about 50 μm from the second major surface 10" of the interposer 10.

Also, on the second major surface 10" of the interposer 10, the wiring layer 150 is disposed on the interposer 10 without having any solder bump layer interposed therebetween, in some embodiments of the present disclosure. In the wiring layer 150, the electrical contact 160 and vertical pillar (not shown) between electrical contacts 160 are formed of any suitable conductive material, such as copper, aluminum, silver, gold, other metals, alloys, combination thereof, and/or the like. The wiring layer is formed by any suitable technique, such as electro-chemical plating (ECP), electroless plating, other deposition methods such as sputtering, printing, and chemical vapor deposition (CVD) methods, or the like. The electrical contact 160 is formed in a layer of insulating material, including dielectric materials, such as polyimide, benzocyclobutene (BCB), $SiO_2$, and $Si_3N_4$, in some embodiments of the present disclosure.

The wiring layer 150 has a top surface contacting a layer of bumps 220. The bumps 220 bond the device layer 180 to the system having the wiring layer 150, the interposer 10, and the inductor layer 90. The bumps 220 have a diameter in the range of about 25 μm to about 60 μm. The bumps 220 are smaller than the solder bumps 260 which have a diameter of about 80 μm to about 100 μm while bumps 220 have a diameter of about 25 μm to about 60 μm.

The device layer 180 includes a processor or chip 190 including a central processing unit (CPU), graphics processing unit (GPU), or any computing component, a memory component 200, and a system-on-chip (SoC) 210. The SoC 210 includes processors and numerous digital peripherals, and comes in a ball grid package with lower and upper connections in some embodiments of the present disclosure. The lower balls connect to a substrate, such as a circuit board and various peripherals, and upper bumps connect to integrated circuits in some embodiments of the present disclosure. In some embodiments of the present disclosure, the SoC 210 includes a controller, processor or digital signal processor (DSP) core—multiprocessor SoCs (MPSoCs) having more than one processor core. In some embodiments of the present disclosure, the SoC 210 includes memory blocks, which include a selection of ROM, RAM, EEPROM, and flash memory. In some embodiments of the present disclosure, the SoC 210 includes timing sources such as oscillators and phase-locked loops. The SoC 210 includes peripherals such as counter-timers, real-time timers and power-on reset generators. In some embodiments of the present disclosure, the SoC 210 includes external interfaces of industry standards such as USB, FireWire, Ethernet, USART, SPI; analog interfaces including ADCs and DACs; and voltage regulators and power management circuits.

The semiconductor device in FIG. 10 includes at least one semiconductor chip or processor 200 which includes an integrated circuit disposed on the second major surface 10" of the interposer 10 adjacent the SoC 210, in some embodiments of the present disclosure. The SoC 210, the processor 190, and the memory component 200 are attached through bumps 220 to a wiring layer 150 on a second major surface 10" of the interposer 20. In this embodiment, the arrangement of the processor 190, memory component 200, and the SoC 210 are in a 2.5 D architecture (the term 2.5 D architecture is originated from the fact that stacking ICs side-by-side on a through silicon interposer can be considered a midpoint between traditional ICs in package representing 2D integration, and chips stacked on top of one another that represents 3D integration architecture). In other embodiments of the present disclosure, the arrangement of devices 190, 200 and SoC 210 are in a 3 D architecture.

On the first major surface of the interposer, a plurality of second passive devices is disposed. The second passive devices located vertically below the first major surface 10' of the interposer 10 are devices different from the first passive devices on the second major surface 10" of the interposer 10, in some embodiments of the present disclosure. In some embodiments of the present disclosure, the second passive devices are magnetic core inductors 110 (one magnetic core inductor 110 is shown in the cross-sectional view of FIG. 10, other inductors are not shown). The inductor 110 functions as an energy storage element for the processor 190 and SoC 210, and volatile type memory component 200. In some embodiments of the present disclosure, the magnetic core inductors 110 having cores 140 are formed in a layer 90 having a thickness of about 50 µm to about 100 µm. In some embodiments of the present disclosure, the inductor 110 having the inductor core 140 in the inductor layer 90 is a ferromagnetic thin film inductor having a single-turn or multi-turn coils with a variety of yoke geometries. The ferromagnetic thin film inductor can be a spiral type, solenoid type, stripe type, and toroidal type. The inductance of the inductor relies on the yoke geometry, for example, a rectangular yoke. Increasing the thickness of the inductor yoke increases the inductance. The eddy current and magnetic loss, however, increase with the increase of the thickness of the inductor yoke, causing the Q factor to be less than one which is undesirable and a reduced inductor efficiency. To vertically incorporate the thin film inductor 110 with the core 140 into the CoWoS architecture in FIG. 10, the geometry of the yoke tends to have a reduced thickness. To achieve a desirably high inductance of about 40 nH with high operating frequency (e.g. about 100 MHz) and with high Q factor (i.e. about 10), spiral and strip type inductors are used in the CoWoS architecture, in some embodiments of the present disclosure. Also, an elongated type inductor is also used in the CoWoS architecture, in some embodiments of the present disclosure. The magnetic core inductor 110 has a thickness less than or in a range from 50 µm to 100 µm.

The magnetic core inductors 110 are in electrical contact with the SoC 210 through conductive contacts formed in through silicon vias (TSVs) 80 in the interposer 10 and the electrical contacts 160 in the wiring layer 150, in some embodiments of the present disclosure. The inductor layer 90 has a bottom surface contacting a solder bump layer 260, in some embodiments of the present disclosure. The inductor layer 90 is disposed between the substrate 280 and the interposer 10, and contacts the interposer 10 without any solder bump layer interposed between the inductor layer 90 and the interposer 10, in some embodiments of the present disclosure.

In some embodiments of the present disclosure, the system of the wiring layer 150, the interposer 10, and the inductor layer 90 is bonded to the substrate 280 through a plurality of solder bumps 50. The bonding of the system, including the inductor layer 90, interposer 10, wiring layer 150, and the device layer 180 with bumps 220 to the substrate 280 is processed by a flip chip method. The solder bumps 260 include a ball grid array (BGA) with individual balls formed of a metal such as tin, silver, copper, or any other suitable materials in some embodiments of the present disclosure.

The solder bumps 260 are formed by initially sputter depositing a seed layer of conductive material (e.g., an underbump metallization) and then patterning a photolithographic material over the seed layer of conductive material (not shown). With the photolithographic material in place and exposing portions of the seed layer, an electro-chemical plating (ECP) process is utilized to plate the exposed portions of the seed layer within the openings of the photolithographic material. Once the plating has finished, the photolithographic material is removed, and the portions of the seed layer that were not plated (because they were covered by the photolithographic material), are removed using, e.g. a dry etch. Once in place, a reflow is performed in order to shape the solder material into the desired bump shape with a diameter of about 250 µm, in some embodiments of the present disclosure.

For the substrate 280 bonded with the system including layers 180, 150, 10, and 90 through the solder bumps 260, a first underfill material 270 is injected or otherwise formed in the space between the inductor layer 90 and the substrate 280, and is then cured to harden. The first underfill material 270 includes a liquid epoxy or epoxy resin and is used to prevent cracks from being generated due to thermal stress in the contacting portions between the solder bumps 260 and the substrate 280, and between the solder bumps 260 and the inductor layer 90.

Figure 11:
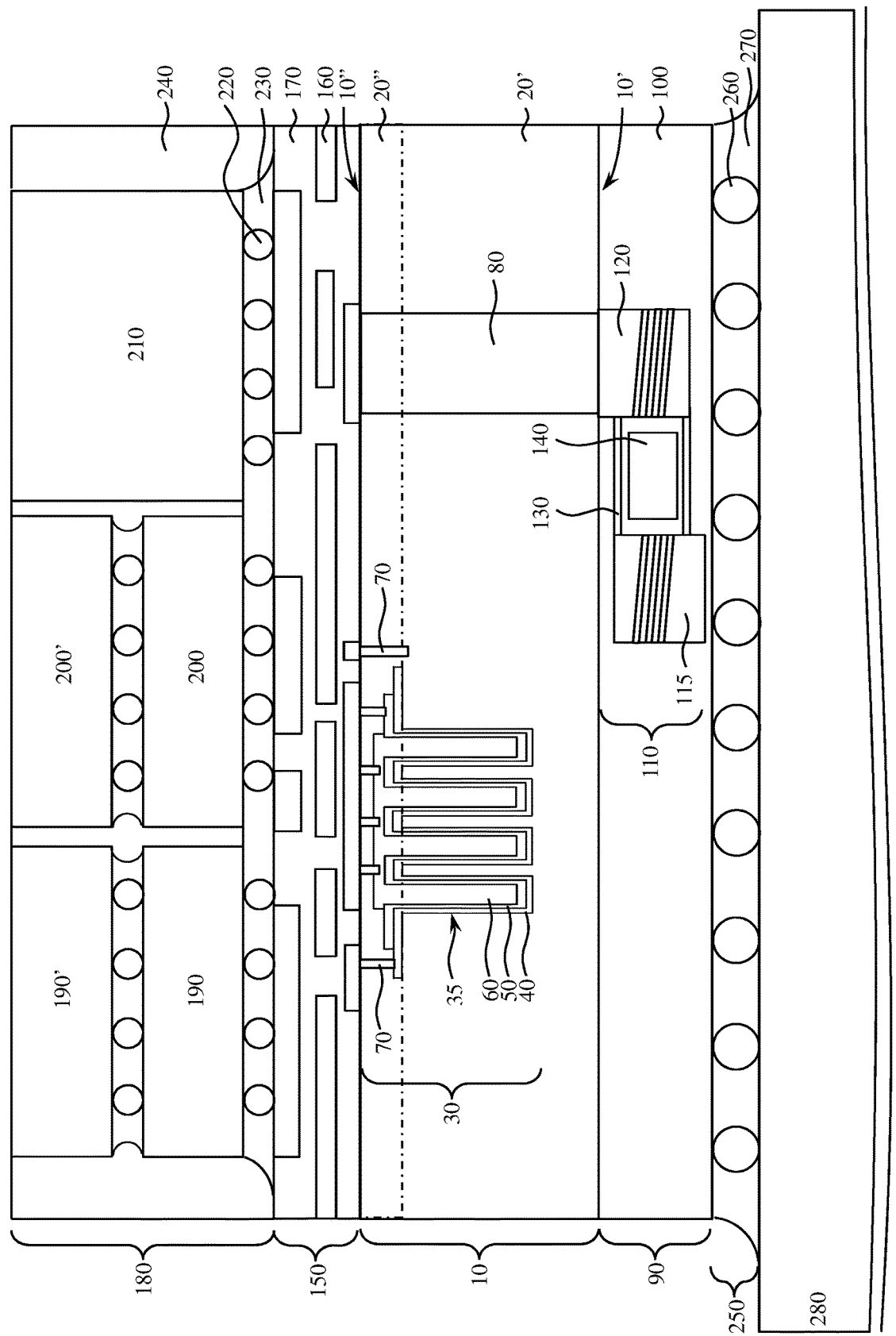
FIG. 11 shows a cross-sectional view illustrating a 3 D CoWoS semiconductor device according to an embodiment of the disclosure.

FIG. 11 shows a cross-sectional view illustrating a 3 D CoWoS semiconductor device according to an embodiment of the disclosure. As shown in FIG. 11, a semiconductor device includes a device layer 180, a wiring layer 150, an interposer 10, an inductor layer 90 having a magnetic core inductor 110 with a vertical central axis of a coil, a solder bump layer 250, and a substrate 280. This embodiment has a similar architecture as that in FIG. 10, except the devices in the device layer 180 are arranged according to a 3 D architecture. That is, FIG. 11 shows that the processors 190 and 190' are stacked vertically through bumps 220. Also, FIG. 11 shows that the memory components 200 and 200' are also stacked vertically through bumps 220. The SoC 210 has an increased size in this embodiment for extensive computation capabilities, in some embodiments of the present disclosure. In some embodiments of the present application, the SoC 210 also includes telecommunication and global positioning devices. In this embodiment, the magnetic core inductor 110 has a vertical central axis of the coil.

Figure 12:
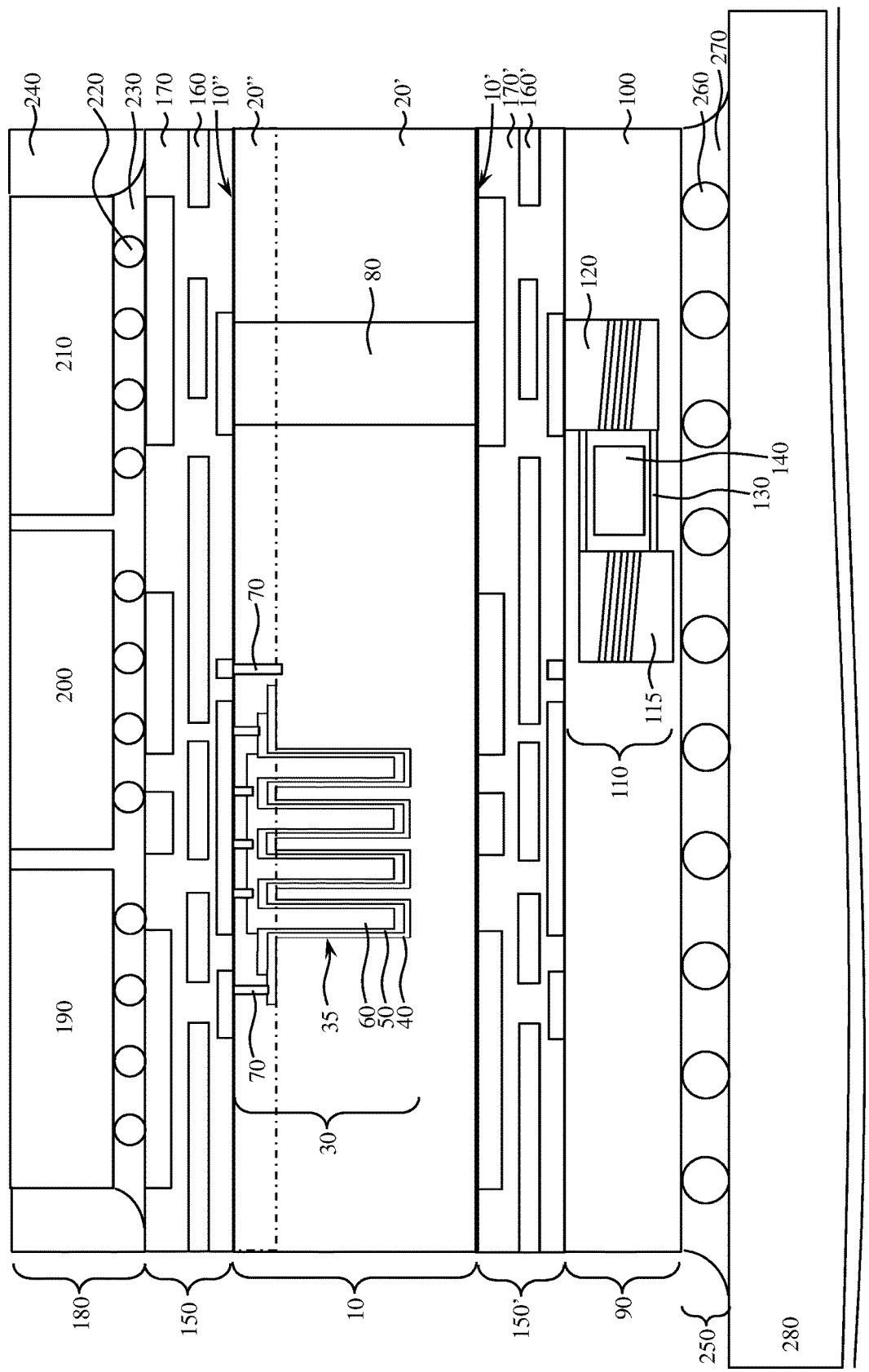
FIG. 12 shows a cross-sectional view illustrating a 2.5 D CoWoS semiconductor device according to an embodiment of the disclosure.

FIG. 12 shows a cross-sectional view illustrating a 2.5 D CoWoS semiconductor device according to another embodiment of the disclosure. As shown in FIG. 12, a semiconductor device includes a device layer 180, a wiring layer 150, an interposer 10, an inductor layer 90 having a magnetic core inductor 110 with a vertical central axis of a coil, a solder bump layer 250, and a substrate 280. This embodiment has a similar architecture as that in FIG. 10, except an additional wiring layer 150' is included. The wiring layer 150' is interposed between the interposer 10 and the inductor layer 90, in some embodiments of the present disclosure. In some embodiments of the present disclosure, the wiring layer 150' is bonded to the inductor layer 90 through bumps 220 (not shown). In some embodiments of the present disclosure, tor the wiring layer 150' bonded to the inductor layer 90, a second underfill (not shown) is injected to the space between the wiring layer 150' and the inductor layer 90, and is then cured to harden. The underfill prevents cracks from being generated in the contacting portion between the wiring layer 150' and the bumps 220 and between the bumps 220 and the inductor layer 90. In this embodiment, the magnetic core inductor 110 has a vertical central axis of the coil.

Figure 13:
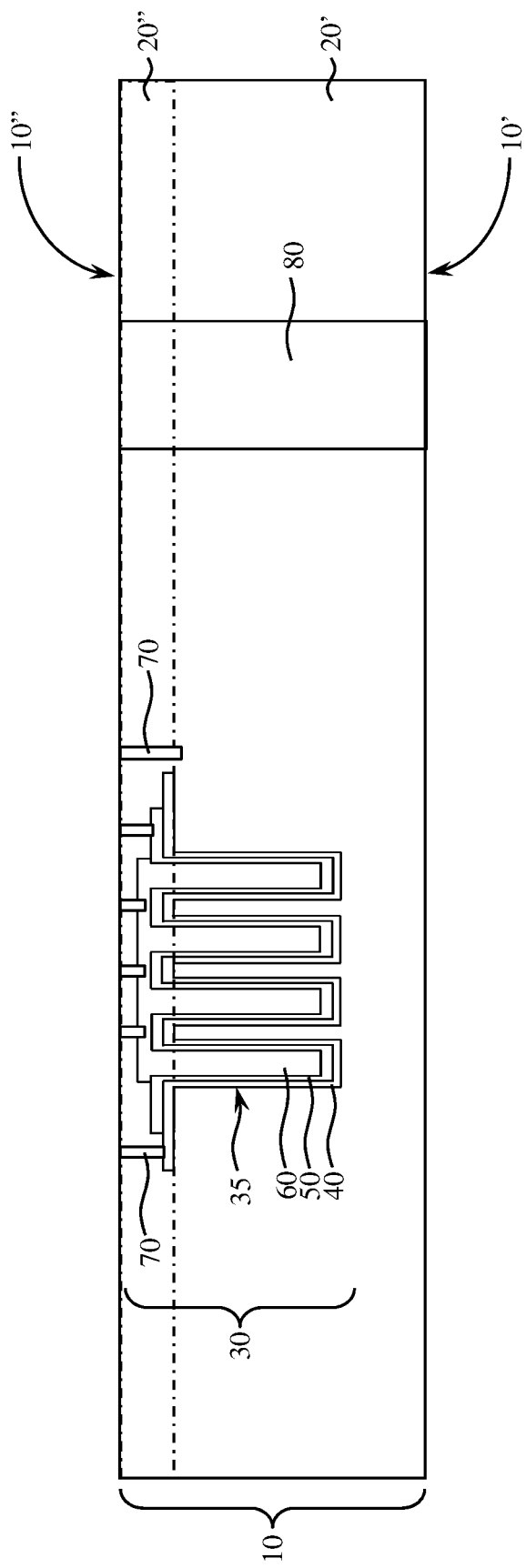
FIG. 13 shows a cross-sectional view illustrating an operation of making the 2.5 D CoWoS semiconductor device of FIG. 10 according to an embodiment of the disclosure.

FIGS. 13 through 18 show cross-sectional views illustrating operations of making the 2.5 D CoWoS semiconductor device of FIG. 10 according to an embodiment of the disclosure. FIG. 13 shows an operation of forming an interposer 10 and forming a deep trench capacitor 30 in the interposer 10. The formation of the interposer 10 includes the operations of forming the through silicon via (TSV) 80 and the operations of forming the deep-trench capacitor 30. High aspect ratio holes, such as the trenches 35 for the deep-trench capacitor 30, or the through silicon via (TSV) requires multiple steps of processing, including mask lithography, deep silicon etch, photoresist deposition and wafer cleaning, liner oxide deposition, barrier metal and copper (Cu) seed sputtering, electro-copper-plating (ECP), copper chemical mechanical polishing (CMP), and an optional TSV capping deposition in some embodiments of the present disclosure.

Mask lithography uses regular photolithography processing technique such as UV or EUV photolithography using a mask having a pattern of through holes or high-aspect ratio holes. A layer of photoresist is coated on the surface of the silicon wafer of the interposer 10. Then, the photoresist is processed through exposure and development to form a pattern of photoresist with openings exposing the top surface of the silicon wafer of the interposer 10.

After formation of the photoresist mask, an operation of deep silicon etch is carried out to form high aspect ratio holes or through silicon holes having a depth of a few tens to a few hundreds of μm. The deep silicon etch uses a $SF_6/O_2$ isotropic etch, in some embodiments of the present disclosure. During the reaction between the plasma of $SF_6$ and oxygen, fluorine is generated to etch the silicon. Since this isotropic etch forms scallops on the sidewall of the etched silicon hole, a passivation process is carried out using $C_4F_8$ to form $CF_2$ which adsorbs on the surface of the sidewalls of the etched silicon hole to form a Teflon-like polymer, flattening the sidewalls of the etched silicon hole. In this process, the high aspect ratio holes (having about 10 μm diameter by 100 μm depth) of the deep-trench capacitor 30 are formed. The fluorine-containing polymers deposited on the sidewalls of the etched silicon holes in the bottom layer 20' of the interposer 10 are removed. In other embodiments of the present application, the deep silicon etch is carried out by reactive ion etch (RIE) or a laser.

An operation of TSV liner deposition is then carried out to deposit a dielectric layer (such as silicon oxide, $SiO_2$) along the sidewalls of the etched silicon hole. The dielectric layer is an electrical insulator. The deposition is carried out by using high temperature thermal oxide deposition, plasma enhanced chemical vapor deposition (PECVD) with the use of silane and tetrathylorthosilicate (TEOS), or sub-atmospheric CVD (SACVD) of ozone $(O_3)$-TEOS.

An operation of barrier layer formation is carried out to form a barrier layer of tantalum (Ta) or titanium (Ti) that prevents copper (Cu) from diffusing from the TSV into the silicon during subsequent high temperature processing. Also, the barrier layer improves the adhesion between the copper seed layer and the dielectric layer of $SiO_2$ formed on the sidewall of the etched silicon hole or through hole. The deposition is carried out by physical vapor deposition (PVD) such as sputtering, pulsed laser deposition or a CVD process, such as MOCVD. Also, a copper seed layer is formed by physical vapor deposition, such as sputtering, in a separate chamber in an Ar plasma.

Then, an electroplating process is carried out to fill the deep silicon hole or through hole with copper or other metal, such as aluminum or tungsten. In this electroplating process, metal ions in a solution are plated onto the electrode by the action of an electric field. The plating can be carried out by conformal, bottom-up, or a mixed of both of conformal and bottom-up methods. In this process, organic additives are added to optimize the plating process. The additives include a suppressor (a chain polymer to coat the copper surface), an accelerator (a catalyst to increase the deposition rate of copper), and a leveler (a substance to deactivate the effect of the accelerator). For the deep silicon hole of the deep trench capacitor 30, electroplating is carried out by coating the sidewall with the copper as the bottom electrode layer of the capacitor 30 without filling the deep silicon hole.

A chemical mechanical polishing (CMP) operation is carried out to remove any metal overburden or mounts formed during the electroplating process. The CMP operation forms an oxide on the top surface of the metal filling the deep silicon hole or through hole and the oxide layer is then removed mechanically with abrasives in the CMP slurry. A high temperature annealing process is optionally carried out before the CMP operation. This annealing process stabilizes the grains of metal, such as copper, in the deep silicon hole or through hole. More than one step of CMP operation is optionally carried out to achieve surface planarization by removing thick metal overburden (e.g. more than 4 μm thick) as the metal overburden would cause a problem of warpage of the interposer 10.

Then, an operation of forming the deep trench capacitor 30 is carried out. A dielectric layer 50 such as a high k dielectric for the capacitor 30 coats the bottom electrode layer 40 by physical vapor deposition (PVD), such as sputtering or pulsed laser deposition, or chemical vapor deposition (CVD), such as MOCVD. Then a top electrode layer 60 fills the remaining space in the deep silicon hole by physical vapor deposition (PVD) such as sputtering or pulsed laser deposition or chemical vapor deposition (CVD) such as MOCVD. A top layer 20" of the interposer 10 covers the capacitor 30 by physical vapor deposition (PVD), such as sputtering or pulsed laser deposition, or chemical vapor deposition (CVD), such as MOCVD. Then, through holes are formed by aforementioned deep silicon etch method and filled by the aforementioned electroplating method to form vias 80.

Figure 14:
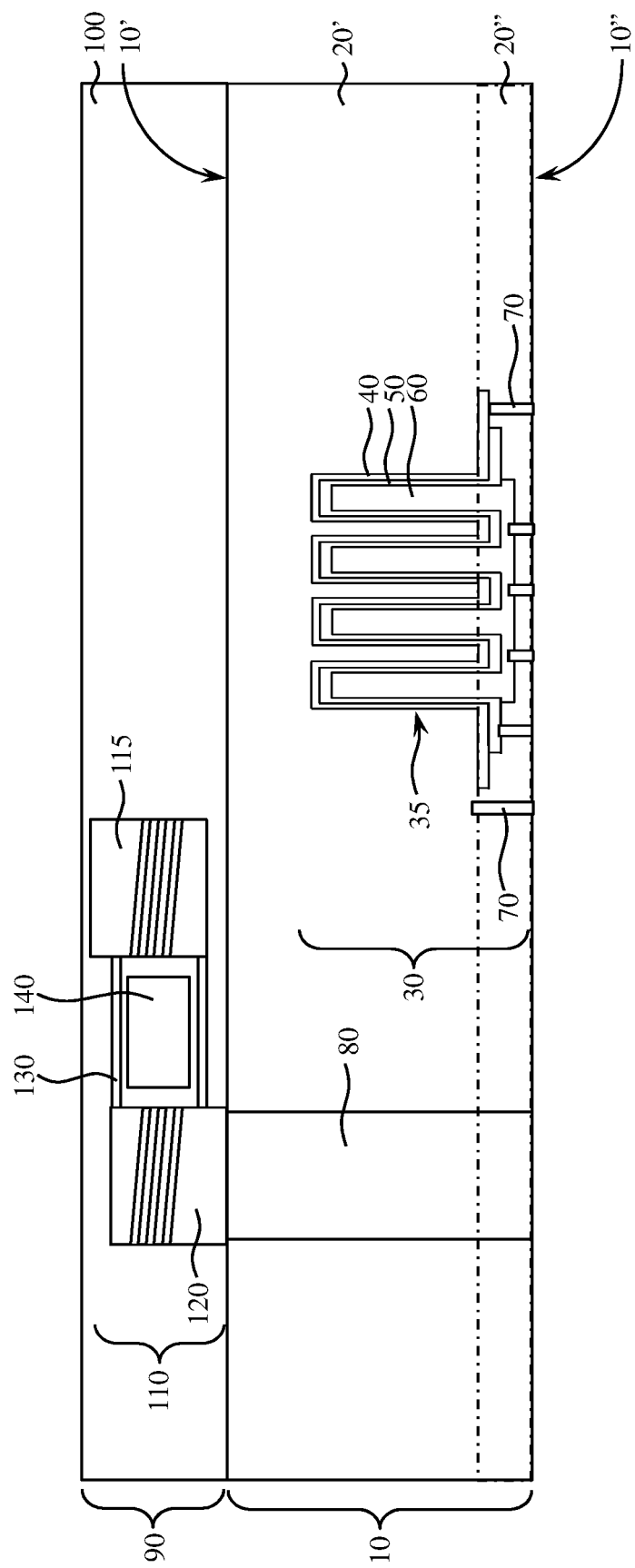
FIG. 14 shows a cross-sectional view illustrating an operation of making the 2.5 D CoWoS semiconductor device of FIG. 10 according to an embodiment of the disclosure.

FIG. 14 shows that an inductor layer 90 is formed on the first major surface 10' of the interposer 10. The first major surface 10' is processed by CMP before forming the inductor 110 on the first major surface 10', in some embodiments of the present disclosure. A dielectric material 100 fills the space around the inductor 110 so as to form the inductor layer 90, in some embodiments of the present disclosure. In another embodiment of the present disclosure, the thin film inductor 110 is formed by deposition of the layers 115, 120, core 140, and via 130, which is a magnetic via in some embodiments of the present disclosure. A dielectric material 100 filling the space around the inductor 110 is deposited by layer depositions to form the inductor layer 90. The dielectric material 100 includes polyimide, benzocyclobutene (BCB), $SiO_2$ and $Si_3N_4$ in some embodiments.

Figure 15:
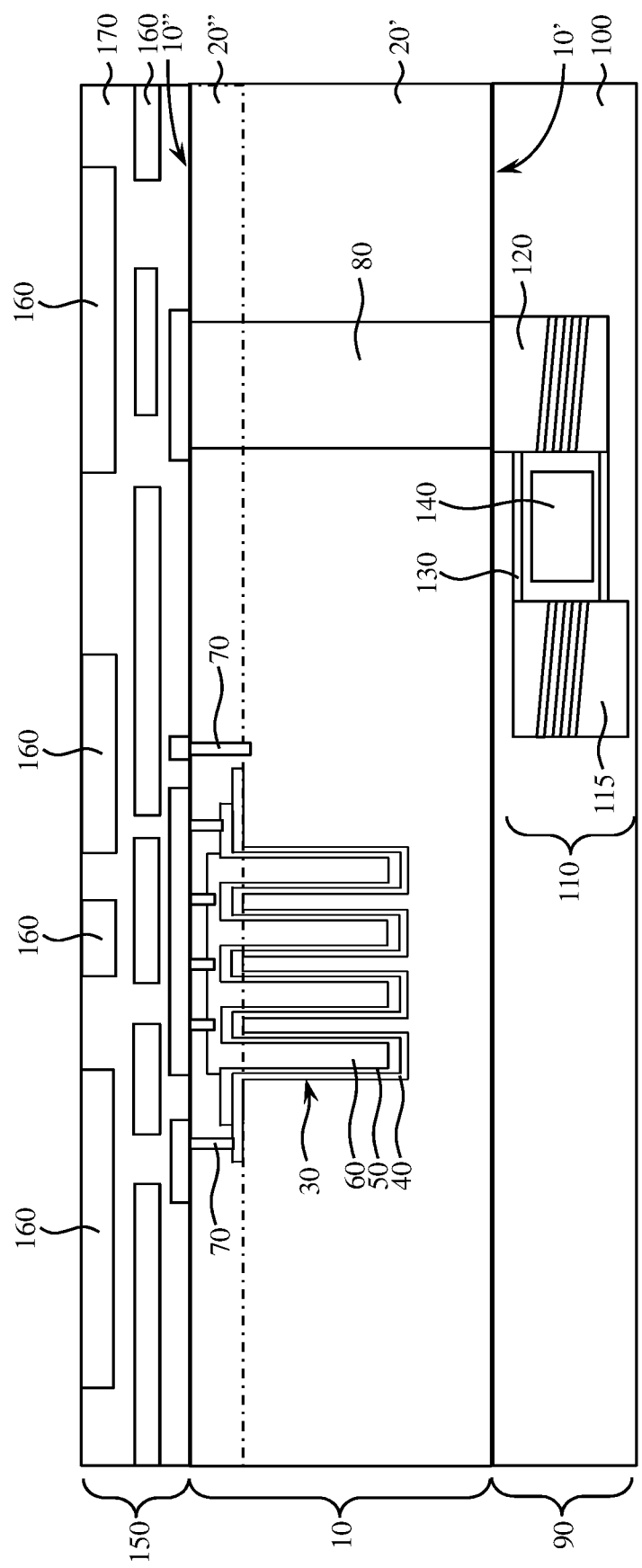
FIG. 15 shows a cross-sectional view illustrating an operation of making the 2.5 D CoWoS semiconductor device of FIG. 10 according to an embodiment of the disclosure.

FIG. 15 shows a cross-sectional view of an operation of forming a wiring layer 150 on the interposer 10. The wiring layer 150 is formed by metal deposition processes or plating process. An electrically insulating layer 170 fills the space between the metal layers in the wiring layer 150. In the wiring layer 150, the electrical contact 160 and vertical pillars (not shown) between electrical contacts 160 are formed of any suitable conductive material, such as copper, aluminum, silver, gold, other metals, alloys, combinations thereof, and/or the like. The contacts and pillars are formed by any suitable technique, such as electro-chemical plating (ECP), electroless plating, other deposition methods such as sputtering, printing, and chemical vapor deposition (CVD) methods, or the like. The electrical contact 160 is formed in a layer of insulating material 170 including dielectric materials such as polyimide, benzocyclobutene (BCB), $SiO_2$, and $Si_3N_4$, in some embodiments of the present disclosure.

Figure 16:
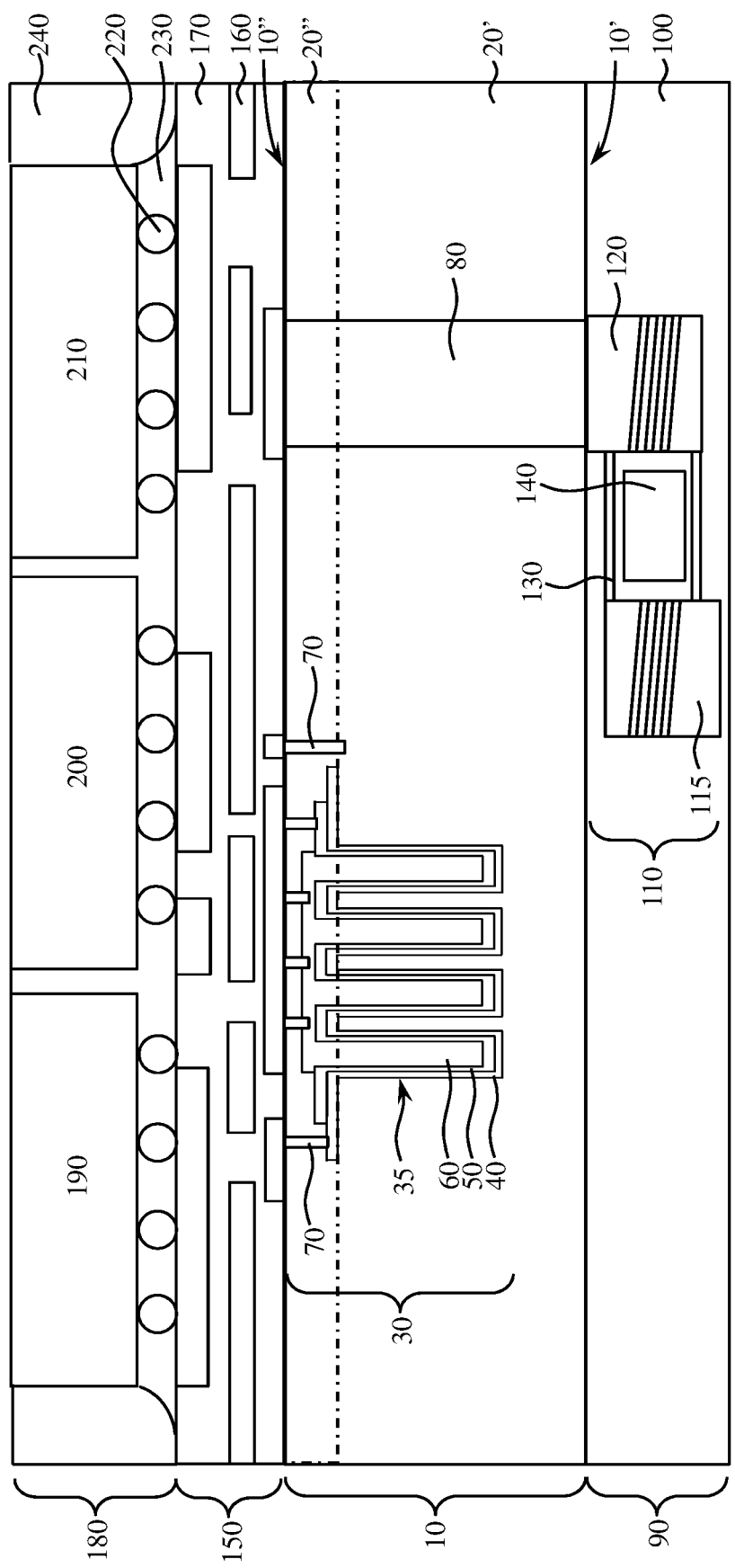
FIG. 16 shows a cross-sectional view illustrating an operation of making the 2.5 D CoWoS semiconductor device of FIG. 10 according to an embodiment of the disclosure.

FIG. 16 shows a cross-sectional view of an operation of forming a device layer 180 on the wiring layer 150. The device layer 180 is formed by bonding the processor 190, memory device 200, and SoC 210 to the contact pads (not shown) on the wiring layer 150 through bumps 220. An underfill 230 fills the space between the device layer 180 and the wiring layer 150, in some embodiments of the present disclosure. In another embodiment of the present disclosure, an air gap is provided between the device layer 180 and the wiring layer 150. An encapsulation layer 240 seals the components 190, 200, and 210, in some embodiments of the present disclosure.

Figure 17:
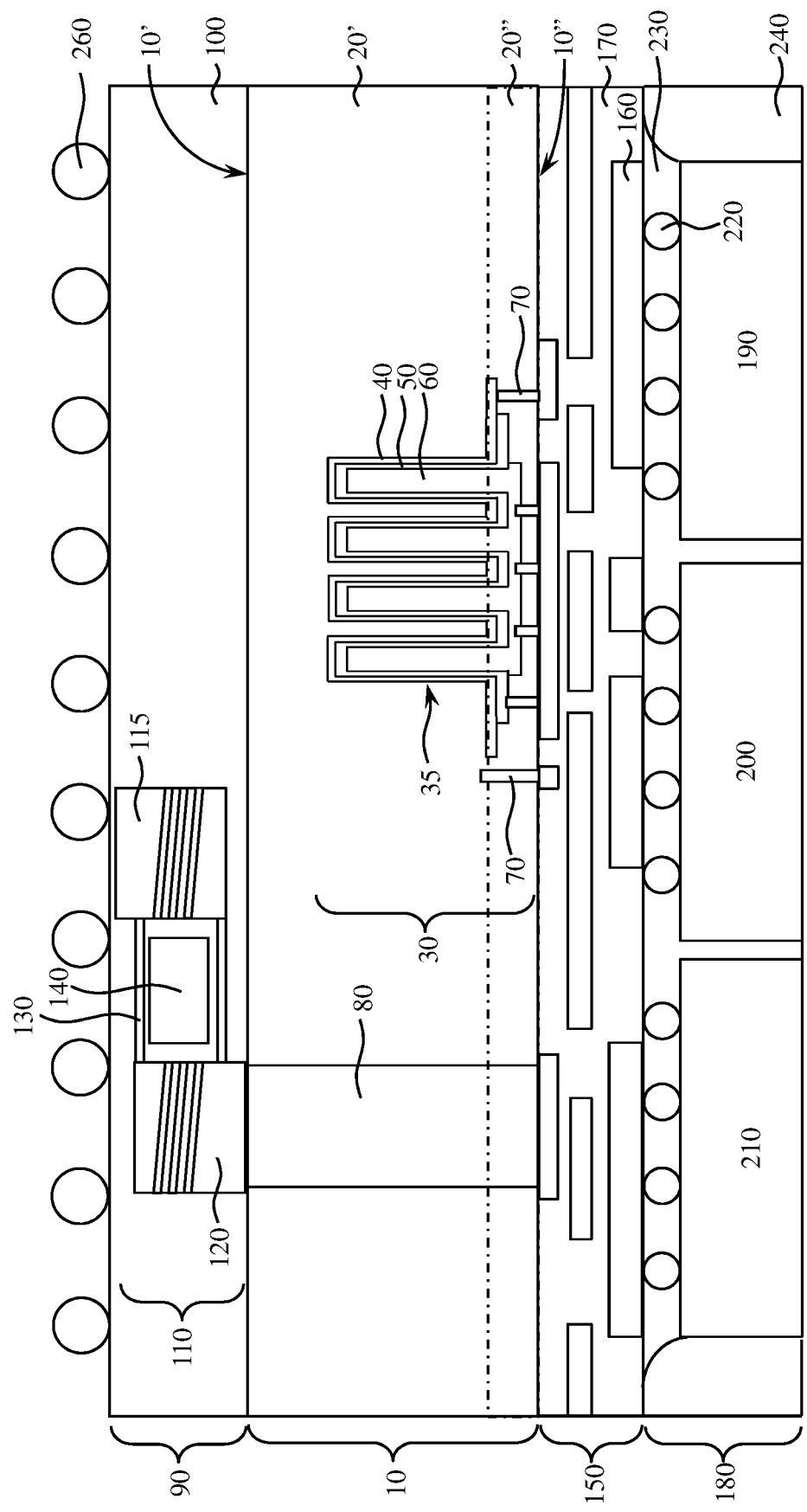
FIG. 17 shows a cross-sectional view illustrating an operation of making the 2.5 D CoWoS semiconductor device of FIG. 10 according to an embodiment of the disclosure.

FIG. 17 shows an operation of forming solder bumps 260 on the inductor layer 90. The solder bumps 260 are formed on contact pads (not shown).

Figure 18:
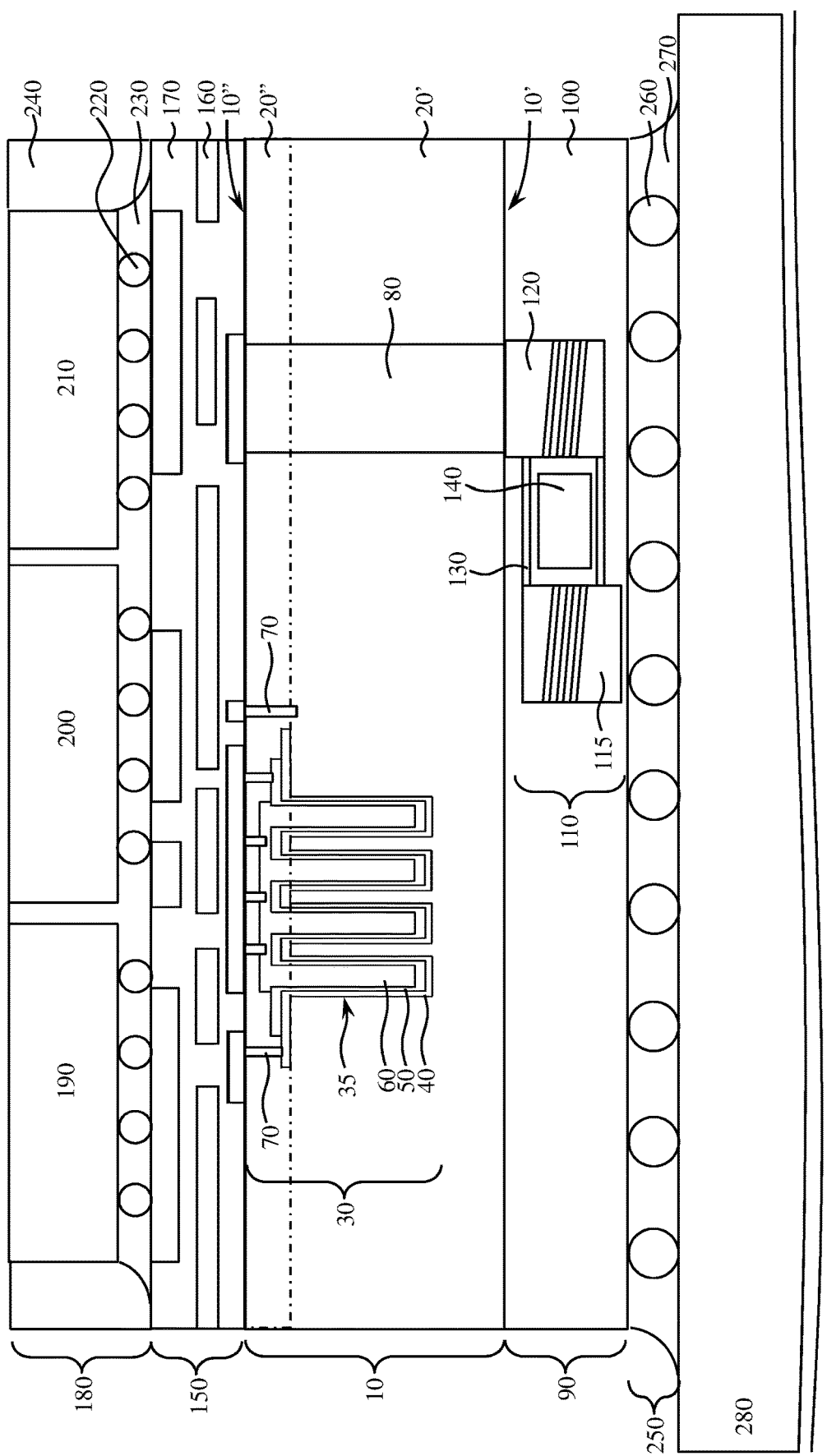
FIG. 18 shows a cross-sectional view illustrating an operation of making the 2.5 D CoWoS semiconductor device of FIG. 10 according to an embodiment of the disclosure, and this cross-sectional view shows the same structure as that in FIG. 10.

FIG. 18 shows a cross-sectional view of a flip chip operation bonding the system to a substrate 280. In this flip chip operation, the system having the inductor layer 90 is flipped over to bond the inductor layer 90 to the substrate 280. An underfill 270 fills the space between the inductor layer 90 and the substrate 280, in some embodiments of the present disclosure. In another embodiment of the present disclosure, an air gap is provided between the inductor layer 90 and the substrate 280.

Figure 19:
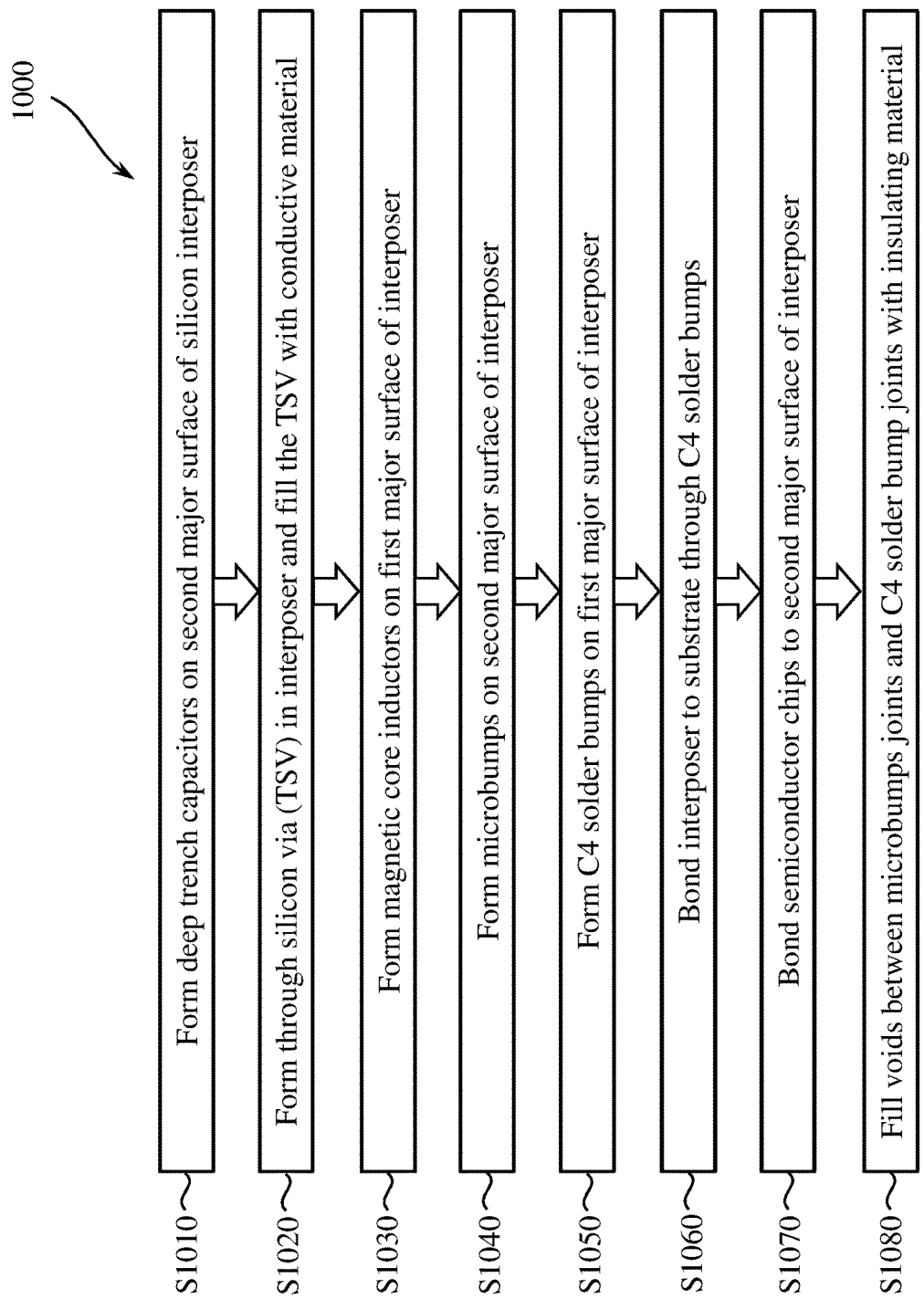
FIG. 19 shows a flow chart of a method of fabricating a CoWoS semiconductor device according to an embodiment of the disclosure.

FIG. 19 shows a flowchart of a method 1000 of fabricating a semiconductor device in FIGS. 1 and 10 including operations 1010 to 1080. Operation 1010 forms a plurality of deep trench capacitors 30 in a second major surface 10" of an interposer 10 such as a silicon interposer, according to an embodiment of the present disclosure. In operation 1020, through silicon vias (TSVs) are formed in the interposer 10 and the TSVs 80 are filled with conductive materials such as a metal including copper. In operation 1030, an inductor layer 90 including a plurality of magnetic core inductors 110 is formed on a first major surface 10' of the silicon interposer 10. In operation 1040, bumps 220 are formed on the second major surface 10" of the interposer 10. A plurality of solder bumps 260 are formed on the first major surface 10' of the silicon interposer 10 in operation 1050. The interposer 10 is soldered to a substrate 280 through the plurality solder bumps 260 so that the first major surface 10' of the interposer 10 faces the substrate 280 in operation 1060. A plurality of semiconductor chips 190, 200, 210 including integrated circuits are soldered to the second major surface 10" of the interposer 10 in operation 1070. Operation 1080 fills the voids between bump 220 joints and solder bump 260 joints with an insulating material 230 or 270 including an epoxy resin or liquid epoxy, in some embodiments of the present disclosure.

In an embodiment of the present disclosure, the forming a plurality of deep trench capacitors 30 in operation 1010 includes forming a hard mask layer (not shown) over the second major surface 10" of the interposer 10, forming a photoresist over the hard mask layer, selectively exposing the photoresist, developing the selectively exposed photoresist, etching the hard mask layer using the developed photoresist as a mask to form openings exposing the interposer 10, and etching the interposer 10 to form trenches of the deep trench capacitor 30 in the interposer 10.

In an embodiment of the present disclosure, at least one of the chips in operation 1070 is a system on a chip 210 having a processor, memory device, and external interfaces. In an embodiment of the present disclosure, the solder bumps 260 have a diameter in the range of about 80 µm to about 100 µm and the bumps 220 have a diameter in the range of about 25 µm to about 60 µm.

Figure 20:
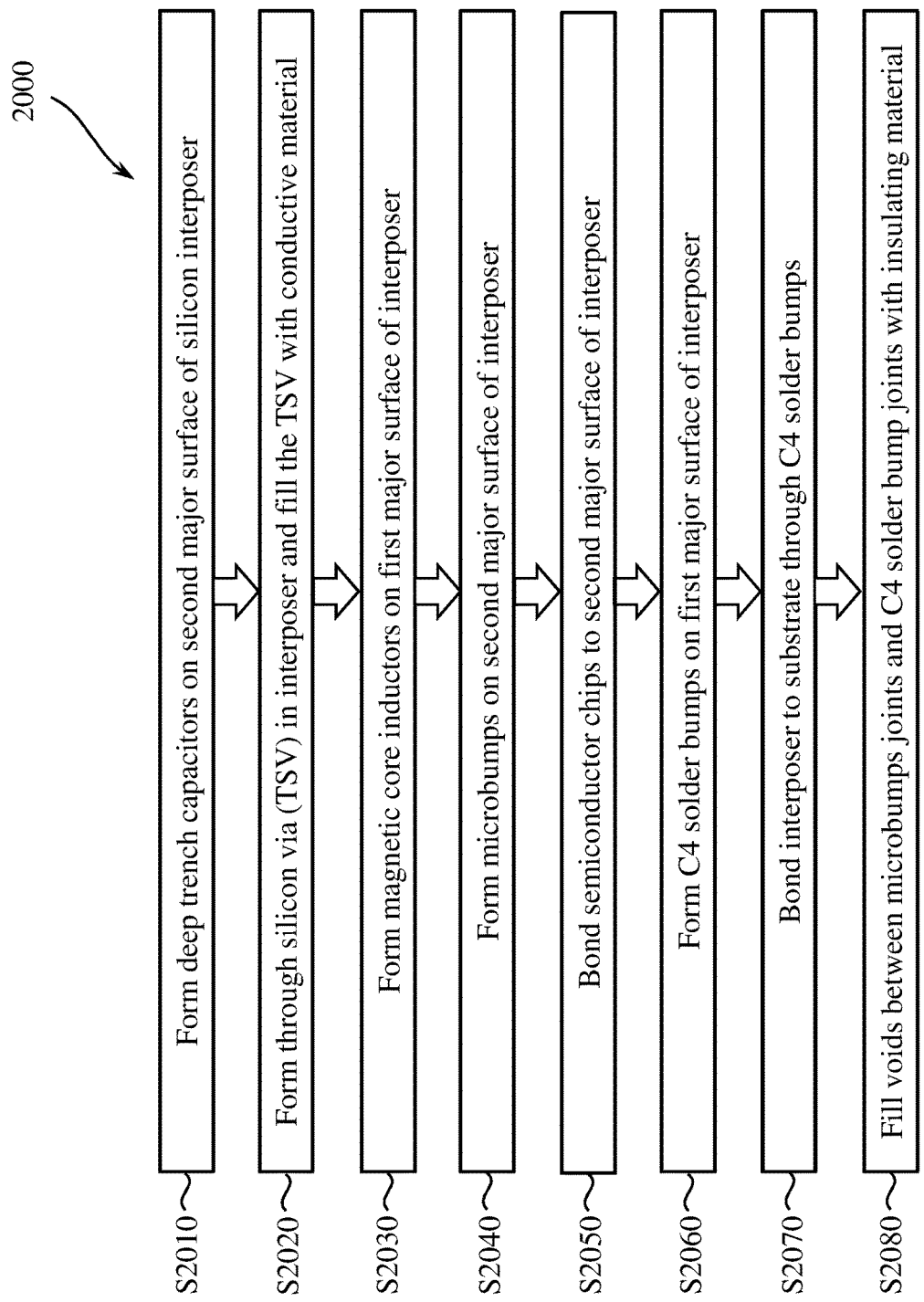
FIG. 20 shows a flow chart of a method of fabricating a CoWoS semiconductor device according to another embodiment of the disclosure.

FIG. 20 shows a flowchart of another method 2000 of fabricating a semiconductor device in FIGS. 1 and 10 including operations 2010 to 2080. Operation 2010 forms a plurality of deep trench capacitors 30 in a second major surface 10" of an interposer 10 such as a silicon interposer, according to an embodiment of the present disclosure. In operation 2020, through silicon vias (TSVs) are formed in the interposer 10 and the TSVs 80 are filled with conductive materials such as a metal including copper. In operation 2030, an inductor layer 90 including a plurality of magnetic core inductors 110 is formed on a first major surface 10' of the silicon interposer 10. In operation 2040, bumps 220 are formed on the second major surface 10" of the interposer 10. A plurality of semiconductor chips 190, 200, 210 including integrated circuits are soldered to the second major surface 10" of the interposer 10 in operation 2050. A plurality of solder bumps 260 are formed on the first major surface 10' of the silicon interposer 10 in operation 2060. The interposer 10 is soldered to a substrate 280 through the plurality solder bumps 260 so that the first major surface 10' of the interposer 10 faces the substrate 280 in operation 2070. Operation 2080 fills the voids between bump 220 joints and solder bump 260 joints with an insulating material 230 or 270 including an epoxy resin or liquid epoxy, in some embodiments of the present disclosure.

Embodiments of the present disclosure provide semiconductor devices with reduced capacitor and inductor parasitic loss. Fabricating semiconductor devices according to the present disclosure provides high-quality process variation control and enhanced component reliability performance. Positioning the deep trench capacitors and magnetic core inductors on opposing sides of the silicon interposer shields the capacitors, chips, and processors on one side of the interposer from heat generated at the magnetic core inductors. The silicon interposer acts as a heat spreader and protects the semiconductor device from overheating. Furthermore, the vertical arrangement of the active devices and passive devices provides a more efficient use of space for the semiconductor device. Devices according to the disclosed embodiments can be fabricated in an economical manner. In addition, locating the magnetic core inductors on an opposing side of the interposer from the chips and processors reduces the electromagnetic interference effect (parasitic inductance coupling (PIC)).

According to an embodiment of the present disclosure, a semiconductor device includes an interposer disposed on a substrate. A first major surface of the interposer faces the substrate. A system on a chip is disposed on a second major surface of the interposer. The second major surface of the interposer opposes the first major surface of the interposer. A plurality of first passive devices is disposed in the second major surface of the interposer. A plurality of second passive devices is disposed on the first major surface of the interposer. The second passive devices are different devices than the first passive devices. In some embodiments of the present disclosure, the second passive devices are magnetic core inductors. In some embodiments of the present disclosure, the magnetic core inductors are in electrical contact with the system on a chip through conductive contacts formed in through silicon vias in the interposer. In some embodiments of the present disclosure, the magnetic core inductors are formed in a layer having a thickness of 50 µm to 100 µm. In some embodiments of the present disclosure, the first passive devices are deep trench capacitors. In some embodiments of the present disclosure, the deep trench capacitors have a trench depth of 20 µm to 50 µm from the second major surface of the interposer. In some embodiments of the present disclosure, the interposer includes silicon. In some embodiments of the present disclosure, the interposer has a thickness of 100 µm to 300 µm. In some embodiments of the present disclosure, at least one semiconductor chip including an integrated circuit is disposed on the second major surface of the interposer adjacent the system on a chip. In some embodiments of the present disclosure, the system on a chip is bonded to the interposer through a plurality of bumps. In some embodiments of the present disclosure, the substrate is bonded to the interposer through a plurality of solder bumps.

According to another embodiment of the present disclosure, a semiconductor device includes a silicon interposer having a first major surface and a second major surface opposing the first major surface, a plurality of deep trench capacitors in the second major surface of the interposer, a plurality of magnetic core inductors formed in a layer on the first major surface of the interposer, and a plurality of semiconductor chips having integrated circuits disposed on the second major surface of the interposer electrically connected to the interposer. The interposer is disposed on a substrate and the first major surface of the interposer faces the substrate and is electrically connected to the substrate. In some embodiments of the present disclosure, the plurality of semiconductor chips is electrically connected to the interposer via a plurality of bumps. In some embodiments of the present disclosure, the substrate is electrically connected to the interposer via a plurality of solder bumps.

According to another embodiment of the present disclosure, a method of fabricating a semiconductor device includes forming a plurality of deep trench capacitors in a second major surface of a silicon interposer. A layer comprising a plurality of magnetic core inductors is formed on a first major surface of a silicon interposer. A plurality of bumps is formed on the second major surface of the silicon interposer. A plurality of solder bumps is formed on the first major surface of the silicon interposer. The interposer is soldered to a substrate through the plurality of solder bumps so that the first major surface of the interposer faces the substrate. A plurality of semiconductor chips including integrated circuits is soldered to the second major surface of the interposer. In some embodiments of the present disclosure, the forming a plurality of deep trench capacitors includes forming a hard mask over the second major surface of the interposer, forming a photoresist over the hard mask, selectively exposing the photoresist, developing the selectively exposed photoresist, etching the hard mask using developed photoresist as a mask to form openings exposing the interposer, and etching the interposer to form trenches in the interposer. In some embodiments of the present disclosure, the method includes forming through silicon vias in the interposer, and filling the vias with a conductive material. In some embodiments of the present disclosure, at least one of the chips is a system on a chip including a processor, memory, and external interfaces. In some embodiments of the present disclosure, the solder bumps have a diameter in the range of 80 µm to 100 µm and the bumps have a diameter in the range of 25 µm to 60 µm. In some embodiments of the present disclosure, the method further includes filling voids between bump joints and solder bump joints with an insulating material.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an interposer disposed on a substrate, wherein a first major surface of the interposer faces the substrate;
   a chip disposed on a second major surface of the interposer, wherein the second major surface of the interposer opposes the first major surface of the interposer;
   a first passive device disposed in the second major surface of the interposer; and
   a second passive device disposed in an inductor layer between the first major surface of the interposer and the substrate, wherein the second passive device is different than the first passive device,
   wherein the first passive device is a deep trench capacitor and the second passive device is a magnetic core inductor, and
   wherein the interposer is made of a semiconductor material and the inductor layer is made of a dielectric material.

2. The semiconductor device of claim 1, wherein the chip is a system on a chip.

3. The semiconductor device of claim 1, wherein the magnetic core inductor is in electrical contact with the system on a chip through conductive contacts formed in through silicon vias in the interposer.

4. The semiconductor device of claim 1, wherein the inductor layer has a thickness of 50 µm to 100 µm.

5. The semiconductor device of claim 2, further comprising at least one semiconductor chip including an integrated circuit disposed on the second major surface of the interposer adjacent the system on a chip.

6. The semiconductor device of claim 2, wherein the system on a chip is bonded to the interposer through a plurality of bumps.

7. The semiconductor device of claim 1, wherein the deep trench capacitors have a trench depth of 20 µm to 50 µm.

8. The semiconductor device of claim 1, wherein the interposer comprises silicon.

9. The semiconductor device of claim 1, wherein the interposer has a thickness of 100 µm to 300 µm.

10. The semiconductor device of claim 1, wherein the substrate is bonded to the interposer through a plurality of solder bumps.

11. The semiconductor device of claim 1, wherein the magnetic core inductor is a ferromagnetic thin film inductor.

12. The semiconductor device of claim 11, wherein the ferromagnetic thin film inductor is a spiral type, solenoid type, stripe type, or toroidal type.

13. A semiconductor device, comprising:
   a silicon interposer having a first major surface and a second major surface opposing the first major surface;
   a plurality of deep trench capacitors in the second major surface of the interposer;
   a plurality of magnetic core inductors formed in an inductor layer between the first major surface of the interposer and a substrate; and
   a plurality of semiconductor chips having integrated circuits disposed on the second major surface of the interposer electrically connected to the interposer,
   wherein the interposer is disposed on the substrate and the first major surface of the interposer faces the substrate and is electrically connected to the substrate,
   the interposer is made of a semiconductor material and the inductor layer is made of a dielectric material.

14. The semiconductor device of claim 13, wherein the plurality of semiconductor chips are electrically connected to the interposer via a plurality of bumps.

15. The semiconductor device of claim 13, wherein the substrate is electrically connected to the interposer via a plurality of solder bumps.

16. A method of fabricating a semiconductor device, comprising:
   forming a plurality of deep trench capacitors in a second major surface of a silicon interposer;
   forming a layer comprising a plurality of magnetic core inductors in an inductor layer between a first major surface of a silicon interposer and a substrate,
   forming a plurality of bumps on the second major surface of the silicon interposer;
   forming a plurality of solder bumps on the first major surface of the silicon interposer;
   soldering the interposer to the substrate through the plurality of solder bumps so that the first major surface of the interposer faces the substrate; and
   soldering a plurality of semiconductor chips including integrated circuits to the second major surface of the interposer,
   wherein the inductor layer is made of a dielectric material.

17. The method according to claim 16, wherein the forming a plurality of deep trench capacitors comprises:
   forming a hard mask over the second major surface of the interposer;
   forming a photoresist over the hard mask;
   selectively exposing the photoresist;
   developing the selectively exposed photoresist;
   etching the hard mask using developed photoresist as a mask to form openings exposing the interposer; and
   etching the interposer to form trenches in the interposer.

18. The method according to claim 16, further comprising forming through silicon vias in the interposer; and
   filling the vias with a conductive material.

19. The method according to any of claim 16, wherein at least one of the chips is a system on a chip comprising a processor, memory, and external interfaces.

20. The method according to any of claim 16, further comprising filling voids between bump joints and solder bump joints with an insulating material.

* * * * *